(12) United States Patent
Oka et al.

(10) Patent No.: US 8,325,524 B2
(45) Date of Patent: *Dec. 4, 2012

(54) SEMICONDUCTOR DEVICE

(75) Inventors: Yasushi Oka, Tokyo (JP); Tadashi Omae, Tokyo (JP); Takesada Akiba, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 226 days.

This patent is subject to a terminal disclaimer.

(21) Appl. No.: 12/903,774

(22) Filed: Oct. 13, 2010

(65) Prior Publication Data
US 2011/0024814 A1 Feb. 3, 2011

Related U.S. Application Data

(62) Division of application No. 12/233,580, filed on Sep. 18, 2008, now Pat. No. 7,839,683.

(30) Foreign Application Priority Data

Sep. 25, 2007 (JP) ................................. 2007-247609

(51) Int. Cl.
*G11C 14/00* (2006.01)
(52) U.S. Cl. .............. 365/185.08; 365/185.05; 257/315; 257/532
(58) Field of Classification Search ............. 365/185.05, 365/185.08; 257/315, 532
See application file for complete search history.

(56) References Cited

U.S. PATENT DOCUMENTS

| 7,839,683 B2 * | 11/2010 | Oka et al. ................ 365/185.08 |
| 2005/0237786 A1 | 10/2005 | Atwood et al. |
| 2006/0198210 A1 | 9/2006 | Hanzawa et al. |
| 2007/0058441 A1 | 3/2007 | Oka et al. |
| 2008/0006868 A1 * | 1/2008 | Hsu et al. .................... 257/314 |

FOREIGN PATENT DOCUMENTS

JP 2007-110073 A 4/2007

* cited by examiner

*Primary Examiner* — Hoai V Ho
(74) *Attorney, Agent, or Firm* — Miles & Stockbridge P.C.

(57) ABSTRACT

The chip area of a semiconductor device including a nonvolatile memory is reduced. The semiconductor device includes a first memory cell and a second memory cell which are formed on the principal surface of a substrate, and arranged adjacent to each other. In a principal surface of the substrate, active regions which are electrically isolated from each other are arranged. In the first active region, the capacitor element of the first memory cell is arranged, while the capacitor element of the second memory cell is arranged in the fourth active region. In the second active region, the respective write/erase elements of the first and second memory cells are both arranged. Further, in the third active region, the respective read elements of the first and second memory cells are both arranged.

4 Claims, 33 Drawing Sheets

SEMICONDUCTOR DEVICE

CROSS-REFERENCE TO RELATED APPLICATIONS

This application is a division of Application Ser. No. 12/233,580 filed Sep. 18, 2008, now issued as U.S. Pat. No. 7,839,683. Also, the disclosure of Japanese Patent Application No. 2007-247609 filed on Sep. 25, 2007 including the specification, drawings and abstract is incorporated herein by reference in its entirety.

BACKGROUND OF THE INVENTION

The present invention relates to a semiconductor device and, more particularly, to a technology which is effective when applied to a semiconductor device including a nonvolatile memory.

An electrically rewritable nonvolatile memory, such as EEPROM (Electrically Erasable Programmable Read Only Memory) or a flash memory, allows on-board rewriting of a program to allow a reduction in development period and an improvement in development efficiency. Besides, the electrically rewritable nonvolatile memory also has a wider range of applications for various uses, such as production of small quantities of many items, destination specific tuning, and post-shipment program update. There is also a growing need for a semiconductor device in which a main circuit and a nonvolatile memory for storing desired data of a relatively small capacity related to the main circuit are embedded in the same semiconductor chip.

An example of a nonvolatile memory cell is a memory cell comprising two transistors, which are a memory transistor for retaining data, and a select transistor for selecting the memory transistor as a so-called memory bit. Of the two transistors, the memory transistor typically has a gate made of polysilicon and having a double-layer structure, in which a floating gate for holding electrons are provided in the lower layer, while a control gate for controlling the potential of the floating gate is provided in the upper layer. Under the floating gate, a tunnel portion comprising an extremely thin insulating film is provided. The rewriting (writing and erasing) of data to such a memory cell is performed by allowing a FN (Fowlor Nordheim) tunnel current to flow via the tunnel portion and causing the injection of electrons into the floating gate or the emission of electrons from the floating gate.

Another example of the nonvolatile memory cell is a memory cell made of a single layer of polysilicon, which is described in, e.g., Japanese Unexamined Patent Publication No. 2007-110073 (Patent Document 1). In the nonvolatile memory cell described in Patent Document 1, a single-layer floating gate electrode is formed on the principal surface of a semiconductor substrate with an insulating film interposed therebetween. At respective positions in a plane of the floating gate electrode, a capacitor portion (capacitor element), a write/erase capacitor portion (write/erase element), and a read portion (read element) are arranged. Patent Document 1 discloses a structure in which rewriting of data is performed with the FN tunnel current of the entire surface of a channel in the data write/erase capacitor portion of the nonvolatile memory cell.

[Patent Document 1]
Japanese Unexamined Patent Publication No. 2007-110073

SUMMARY OF THE INVENTION

In the manufacturing of a nonvolatile memory comprising a double-layer polysilicon gate, the nonvolatile memory undergoes a manufacturing process more complicated than that of a nonvolatile memory comprising a single-layer polysilicon gate. That is, in the nonvolatile memory comprising the double-layer polysilicon gate, providing mutual electrical isolation between two polysilicon layers presenting a complicated configuration may be difficult in terms of reliability, or manufacturing process steps may increase to increase manufacturing cost.

By contrast, a nonvolatile memory having a single-layer polysilicon gate as described in Patent Document 1 mentioned above comprises a single-layer polysilicon layer and an insulating film provided thereunder, so that the manufacturing process thereof is not more complicated than that of the nonvolatile memory having the double-layer polysilicon gate. In the semiconductor device in which the main circuit and the nonvolatile memory are embedded, when the main circuit comprises a single-layer polysilicon layer, the nonvolatile memory with the single-layer polysilicon gate can also be formed as the nonvolatile memory in the flow of the basic manufacturing process for forming the main circuit. Accordingly, manufacturing cost can also be suppressed.

However, in the construction of the function of rewiring data, when a simple comparison is made between the nonvolatile memory having the single-layer polysilicon gate and the nonvolatile memory having the double-layer polysilicon gate, the nonvolatile memory having the single-layer polysilicon gate, and comprising the single-layer polysilicon layer conceivably has a larger chip area than that of the nonvolatile memory having the double-layer polysilicon gate, and comprising two vertically stacked layers.

An object of the present invention is to provide a technology which can reduce the chip area of a semiconductor device comprising a nonvolatile memory, particularly a semiconductor device comprising a nonvolatile memory comprising a single-layer polysilicon gate.

The above and other objects and novel features of the present invention will become apparent from the description of the present specification and the accompanying drawings.

As shown below, a brief description will be given to the outline of a representative aspect of the invention disclosed in the present application.

An embodiment of the present invention is a semiconductor device including a first nonvolatile memory cell and a second nonvolatile memory cell which are formed on the principal surface of a semiconductor substrate to be arranged adjacent to each other. In the principal surface, a first active region, a third active region, a second active region, and a fourth active region, which are electrically isolated from each other, are arranged. In the first active region, the capacitor element of the first nonvolatile memory cell is formed. In the third active region, the respective read elements of the first and second nonvolatile memory cells are both formed. In the second active region, the respective write/erase elements of the first and second nonvolatile memory cells are both formed. In the fourth active region, the capacitor element of the second nonvolatile memory cell is formed.

The following is a brief description of an effect achievable by the representative aspect of the invention disclosed in the present application.

That is, the chip area of a semiconductor device having a nonvolatile memory can be reduced.

DETAILED DESCRIPTION OF THE PREFERRED EMBODIMENTS

Figure 1:
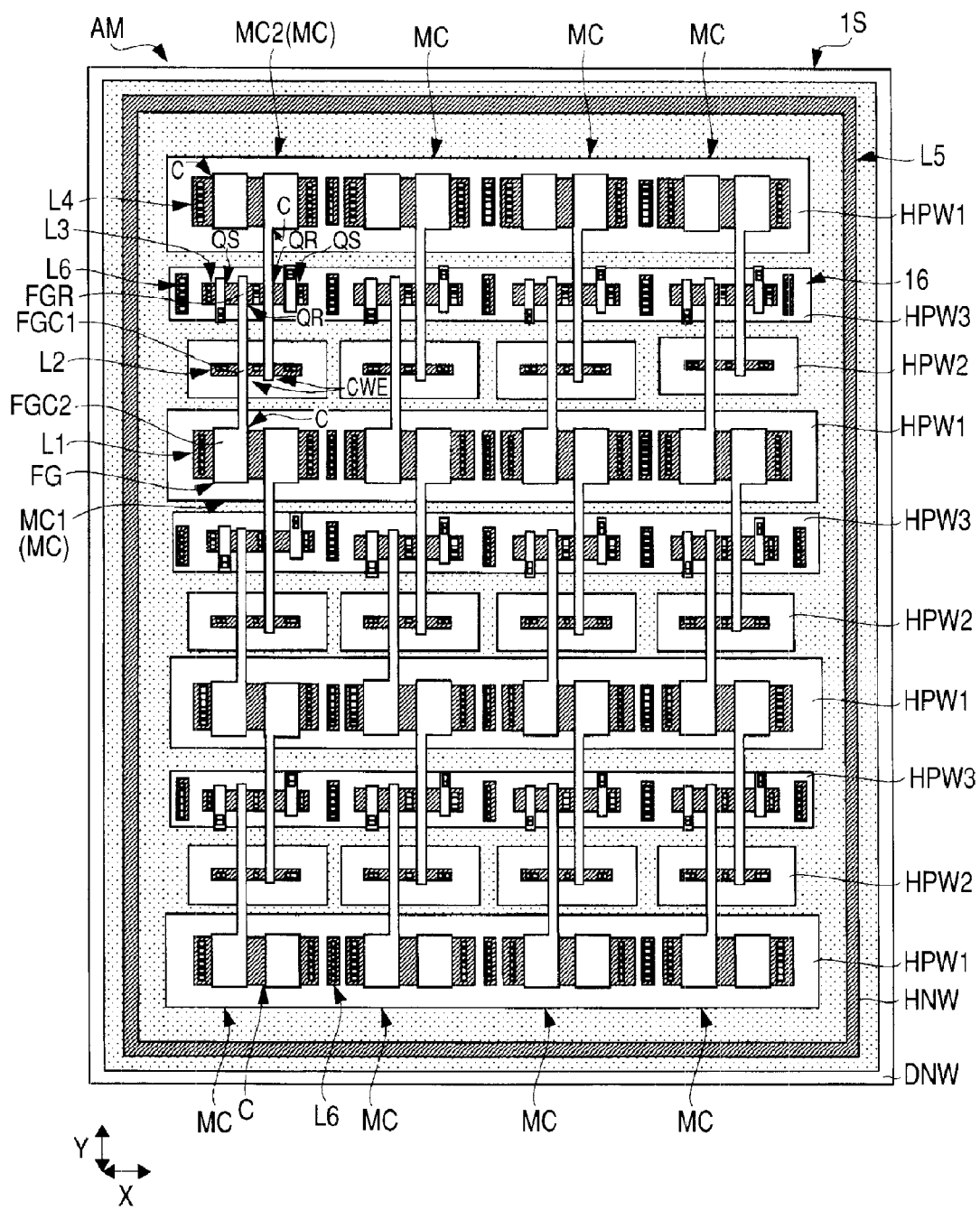
FIG. 1 is a plan view of a nonvolatile memory (in the case of having a 24-bit configuration) arranged in a nonvolatile memory region in a first embodiment of the present invention.

Referring to the drawings, the embodiments of the present invention will be described hereinbelow in detail. Throughout all the drawings for illustrating the embodiments, the members having the same functions are provided with the same reference numerals, and a repeated description thereof may be omitted. In the drawings for illustrating the following embodiments, even a plan view may be hatched for clear illustration of a structure.

(Embodiment 1)

In a semiconductor device according to a first embodiment of the present invention, a main circuit and a nonvolatile memory for storing desired data (information) of a relatively small capacity related to the main circuit are formed respectively in a main circuit region and a nonvolatile memory region, which are arranged in the same semiconductor chip (semiconductor substrate). The semiconductor substrate (hereinafter referred to as the "substrate") configuring the semiconductor chip has a principal surface (element formation surface) formed with the main circuit and the nonvolatile memory, and a back surface opposite to the principal surface. A description will be given hereinbelow of a semiconductor device (LCD driver) in which a nonvolatile memory for storing desired information related to a main circuit is formed on a semiconductor chip formed with an LCD (Liquid Crystal Device) driver circuit as the main circuit. The LCD driver described in the present embodiment indicates a semiconductor device for driving or controlling a display panel such as a liquid crystal display panel.

Figure 2:
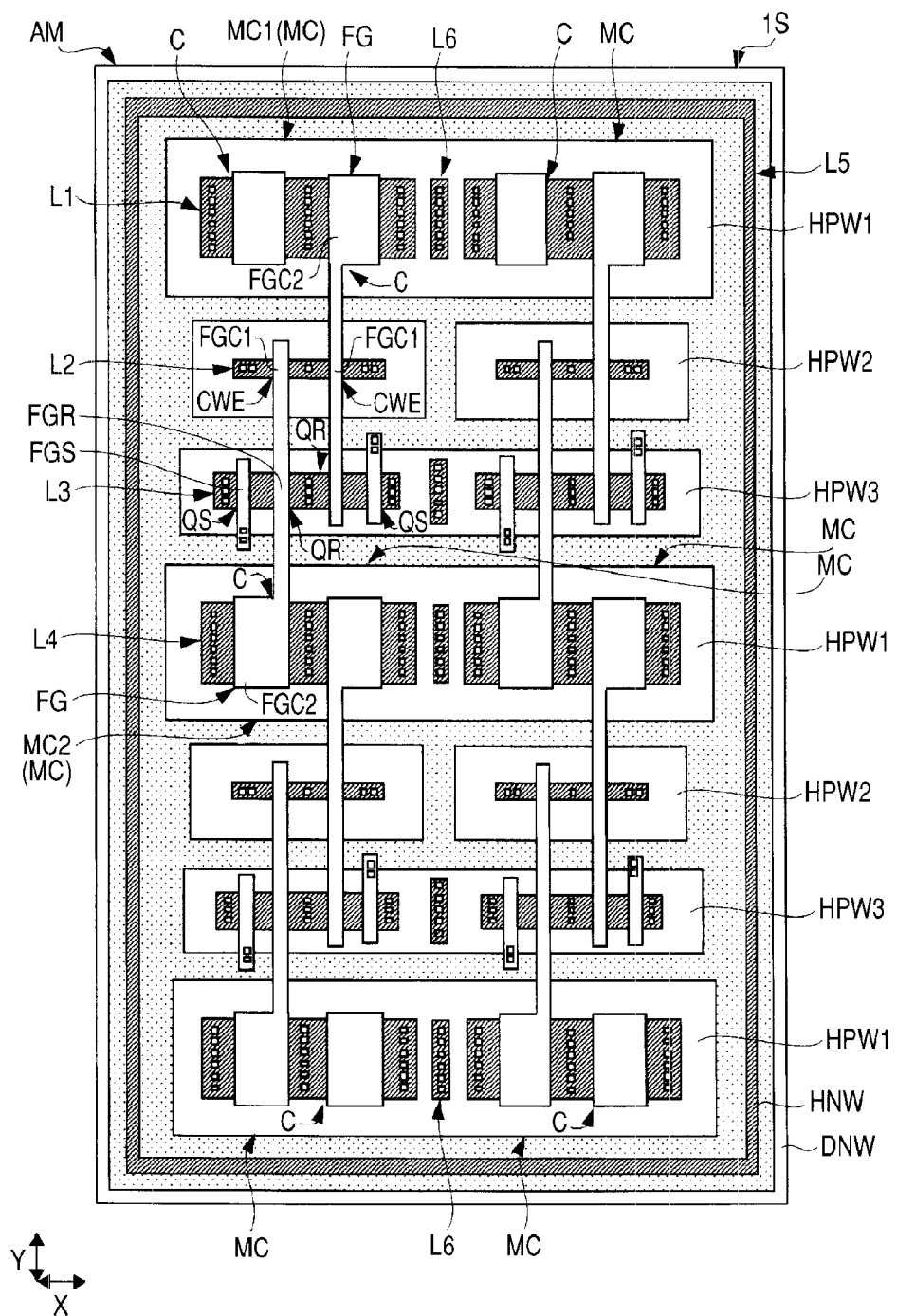
FIG. 2 is a plan view of the nonvolatile memory (in the case of having a 8-bit configuration) arranged in the nonvolatile memory region in the first embodiment.
Figure 3:
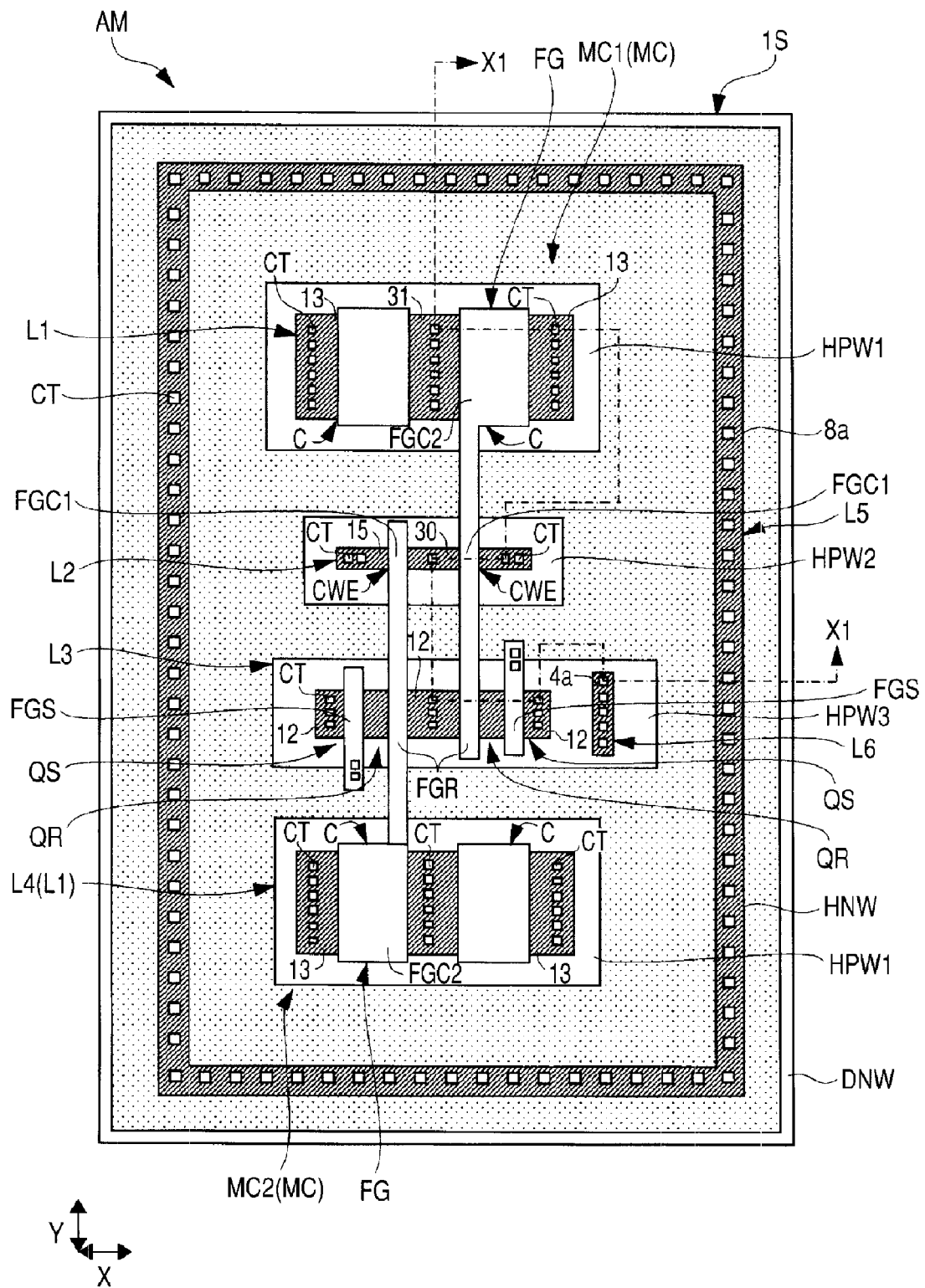
FIG. 3 is a plan view of the nonvolatile memory (in the case of having a 2-bit configuration) arranged in the nonvolatile memory region in the first embodiment.
Figure 4:
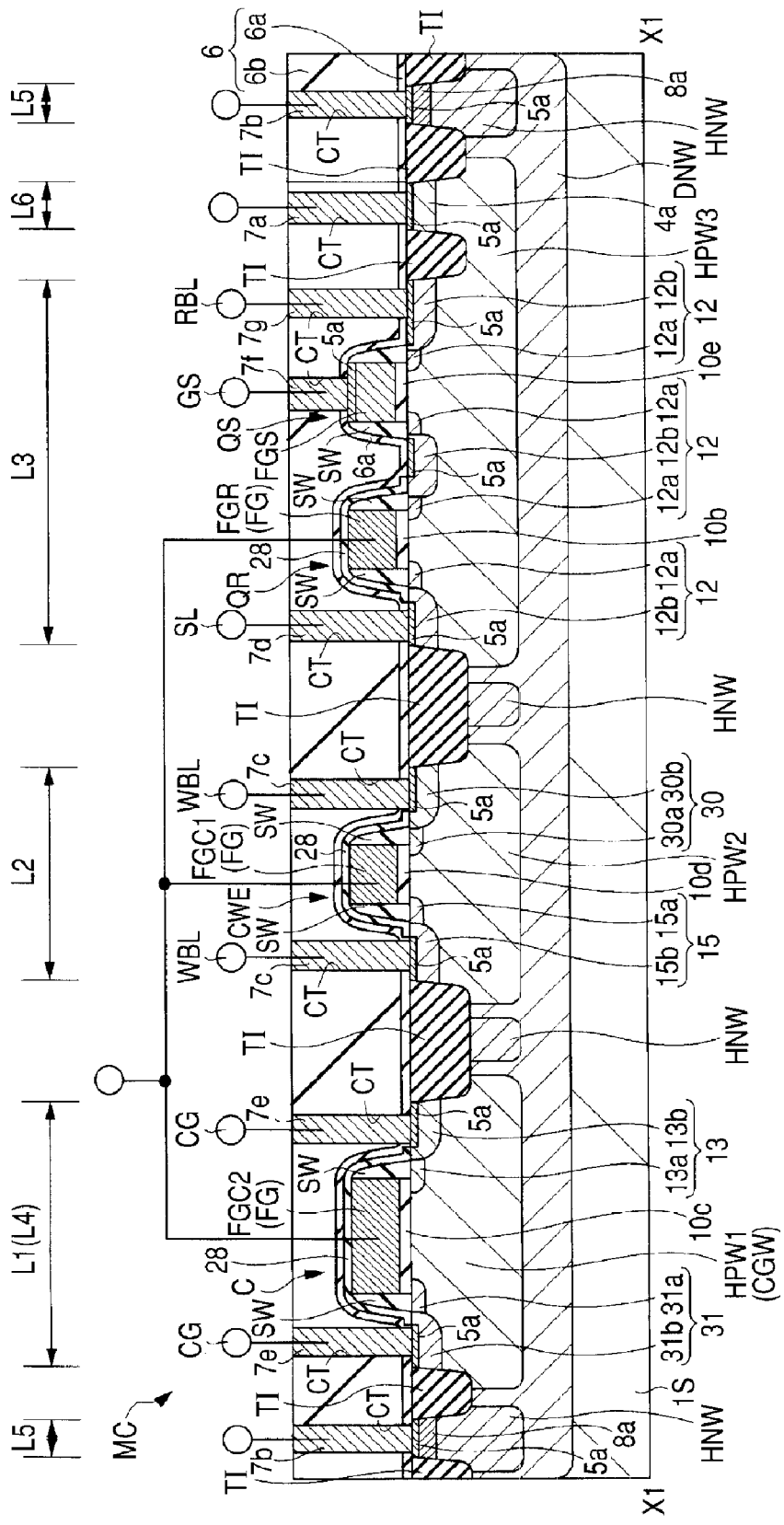
FIG. 4 is a cross-sectional view of a nonvolatile memory cell in the semiconductor device in the first embodiment.

FIGS. 1 to 3 are plan views of the nonvolatile memory arranged in a nonvolatile memory region AM, which show the respective cases where the nonvolatile memory has a 24-bit configuration, a 8-bit configuration, and a 2-bit configuration. FIG. 4 is a cross-sectional view of a nonvolatile memory cell in the semiconductor device according to the present embodiment, which shows the cross section along the line X1 to X1 of FIG. 3 as a representative. In FIGS. 1 to 3, a part of, e.g., an insulating layer formed to cover the nonvolatile memory cell or the like is omitted for clear illustration of the placement of the nonvolatile memory cell.

As shown in FIGS. 1 to 3, the nonvolatile memory according to the present first embodiment comprises a plurality of nonvolatile memory cells (hereinafter referred to as the "memory cells") formed on the principal surface of a substrate 1S. Each of the nonvolatile memory cells MC comprises a data write/erase element CWE, a data read element QR, and a capacitor element C. These memory cells MC are arranged at the positions where bit lines (arranged in the first direction Y in the drawing) and word lines (arranged in the second direction X in the drawing) which are arranged in a matrix intersect each other.

The plurality of nonvolatile memory cells MC formed on the principal surface of the substrate 1S include a memory cell MC1 and a memory cell MC2 which are arranged adjacent to each other. In the principal surface of the substrate 1S, active regions L1 to L6 electrically isolated from each other are arranged. The active regions used in the present application are regions where elements are formed, and which are defined by an isolation region (isolation portion).

In the active regions L1 to L4, the capacitor element C of the memory cell MC1 is formed in the active region L1, the respective read elements QR of the memory cells MC1 and MC2 are both formed in the active region L3, the respective write/erase elements CWE of the memory cells MC1 and MC2 are both formed in the active region L2, and the capacitor element C of the memory cell MC2 is formed in the active region L4.

Thus, in the semiconductor device according to the first embodiment, the respective read elements QR of the memory cells MC1 and MC2 are formed in the common active region L3, and the respective write/erase elements CWE of the memory cells MC1 and MC2 are formed in the common active region L2. As a result, it is possible to reduce the chip area.

In the present first embodiment, the nonvolatile memory for storing desired information related to the main circuit is formed in the semiconductor chip formed with the LCD drive circuit as the main circuit. Examples of the desired information include information on addresses in the semiconductor chip where valid (in-use) elements used in trimming are placed, information on addresses where a valid memory cell (non-defective memory cell) and a valid LCD element each used in giving relief to the memory or the LCD are placed, trimming tap information of an adjustment voltage used during adjustment of an LCD image, and the production number of the semiconductor device. As these desired information items increase, the amount of information (the number of memory cells) in the nonvolatile memory increases. Even when the number of memory cells has thus increased, by disposing memory cells as shown in the present first embodiment, an increase in chip area can be suppressed.

Next, a description will be given specifically of the structure of each of the memory cells MC according to the first embodiment with reference to FIGS. 3 and 4. Each of the memory cells MC shown in FIGS. 1 and 2 also has the same structure.

In the principal surface of the p-type substrate 1S, a trench-type isolation portion TI defining the active regions L1 to L6 is formed. In an n-type (first conductivity type) buried well (first well) DNW formed in the substrate 1S, p-type (second conductivity type) wells HPW1, HPW2, and HPW3, and an n-type well HNW are formed. The p-type wells HPW1, HPW2, and HPW3 are included in the buried well DNW, while being electrically isolated from each other by the buried well DNW and the n-type well HNW.

Each of the p-type wells HPW1 to HPW3 contains an impurity showing the p-type conductivity such as, e.g., boron (B). In a part of the upper portion of the p-type well HPW3, a p'-type semiconductor region 4a is formed in a layer. The p⁻-type semiconductor region 4a contains the same impurity as contained in the p-type well HPW3, but the impurity concentration of the p⁻-type semiconductor region 4a is set to be higher than that of the p-type well HPW3. The p⁻-type semiconductor region 4a is electrically coupled to conductor portions 7a in contact holes CT formed in an insulating layer 6 over the principal surface of the substrate 1S. A silicide layer 5a may also be formed in a part of the top surface of the p'-type semiconductor region 4a in contact with the conductor portions 7a.

The n-type well HNW contains an impurity showing the n-type conductivity such as, e.g., phosphorus (P) or arsenic (As). In a part of the upper surface of the n-type well HNW, an n⁺-type semiconductor region 8a is formed in a layer. The n⁻-type semiconductor region 8a contains the same impurity as contained in the n-type well HNW, but the impurity concentration of the n⁻-type semiconductor region 8a is set to be higher than that of the n-type well HNW. The n⁺-type semiconductor region 8a is apart from the p-type wells HPW1 to HPW3 so as not to be in contact with the p-type wells HPW1 to HPW3. That is, a part of the n-type buried well DNW is interposed between the n'-type semiconductor region 8a and each of the p-type wells HPW1 to HPW3. The n⁺-type semiconductor region 8a is electrically coupled to conductor portions 7b in the contact holes CT formed in the insulating layer 6. The silicide layer 5a may also be formed in a part of the top surface of the n⁺-type semiconductor region 8a in contact with the conductor portions 7b.

The memory cell MC according to the present first embodiment has a floating electrode FG, a data write/erase element CWE, a data read element QR, and a capacitor element C.

The floating electrode FG is a portion in which charges contributing to the storage of data are accumulated. The floating electrode FG is made of a conductor film of, e.g., low-resistance polysilicon or the like, and formed in an electrically floating state (state insulated from another conductor). As shown in FIG. 3, the floating electrode FG is formed in a state extending along the first direction Y to two-dimensionally overlap the mutually adjacent p-type wells HPW1, HPW2, and HPW3.

At a first position where the floating electrode FG two-dimensionally overlaps the active region L2 of the p-type well HPW2, the write/erase element CWE as a write/erase capacitor element is arranged. The write/erase element CWE has a capacitor electrode FGC1, a capacitor insulating film 10d, a p-type semiconductor region 15, an n-type semiconductor region 30, and the p-type well HPW2.

The capacitor electrode FGC1 is a portion formed of a part of the floating electrode FG to form one of the electrodes of the write/erase element CWE. The capacitor insulating film 10d is made of, e.g., silicon dioxide, and formed between the capacitor electrode FGC1 and the substrate 1S (p-type well HPW2). The thickness of the capacitor insulating film 10d is in a range of, e.g., not less than 7 nm and not more than 20 nm. In the write/erase element CWE according to the present first embodiment, electrons are injected from the p-type well HPW2 into the capacitor electrode FGC1 via the capacitor insulating film 10d, or emitted from the capacitor electrode FGC1 to the p-type well HPW2 via the capacitor insulating film 10d in the rewriting of data. Accordingly, the thickness of the capacitor insulating film 10d is small, and specifically set to a thickness of the order of, e.g., 13.5 nm. The reason for setting the thickness of the capacitor insulating film 10d to 7 nm or more is that, when the thickness of the capacitor insulating film 10d is less than 7 nm, the reliability of the capacitor insulating film 10d cannot be ensured. On the other hand, the reason for setting the thickness of the capacitor insulating film 10d to 20 nm or less is that, when the thickness of the capacitor insulating film 10d is more than 20 nm, it is difficult to cause electrons to pass through the capacitor insulating film 10d, and therefore the rewriting of data cannot be performed properly.

The pair of the p-type semiconductor region 15 and the n-type semiconductor region 30 of the write/erase element CWE are formed at positions sandwiching the capacitor electrode FGC1 therebetween in the p-type well HPW2 by self alignment with respect to the capacitor electrode FGC1. The p-type semiconductor region 15, the n-type semiconductor region 30, and the p-type well HPW2 are portions each forming one of the electrodes of the write/erase element CWE. That is, in the write/erase element CWE, the conductivity types of the semiconductor regions on the left and right sides of the capacitor electrode FGC1 are asymmetric. With such a structure, it is possible to suppress or prevent the formation of a depletion layer in the substrate 1S during the erasing or writing of data.

The p-type semiconductor region 15 has a channel-side $p^-$-type semiconductor region 15a, and a $p^+$-type semiconductor region 15b electrically coupled to the semiconductor region 15a. Each of the p-type semiconductor region 15a and the p-type semiconductor region 15b contains an impurity of the same conductivity type such as, e.g., boron (B), but the impurity concentration of the $p^+$-type semiconductor region 15b is set to be higher than that of the $p^-$-type semiconductor region 15a. The p-type semiconductor region 15 is electrically coupled to the p-type well HPW2.

On the other hand, the n-type semiconductor region 30 has a channel-side $n^-$-type semiconductor region 30a, and an $n^+$-type semiconductor region 30b electrically coupled to the $n^-$-type semiconductor region 30a. Each of the $n^-$-type semiconductor region 30a and the $n^-$-type semiconductor region 30b contains an impurity of the same conductivity type such as, e.g., phosphorus (P) or arsenic (As), but the impurity concentration of the n'-type semiconductor region 30b is set to be higher than that of the $n^-$-type semiconductor region 30a.

Each of the $p^-$-type semiconductor region 15a and the $n^-$-type semiconductor region 30a extends from around one of the end portions of the capacitor electrode FGC1 along the principal surface of the substrate 1S by a distance nearly equivalent to the width of each of sidewalls SW to terminate.

The $p^-$-type semiconductor region 15a and the $n^-$-type semiconductor region 30a partly overlap at the respective terminal ends thereof, and extend from the overlap position along the principal surface of the substrate 1S by a desired length to terminate at the isolation portion TI.

In the present first embodiment, the n-type semiconductor region 30 is formed between the two mutually adjacent floating electrodes FG, as shown in FIG. 3. That is, the n-type semiconductor region 30 serves as a common region between the two write/erase elements CWE.

The p-type semiconductor region 15 and the n-type semiconductor region 30 are electrically coupled to conductor portions 7c in the contact holes CT formed in the insulating layer 6. The conductor portions 7c are electrically coupled to data write/erase bit lines WBL. The silicide layer 5a may also be formed in a part of the top surface of each of the $p^-$-type semiconductor region 15b and the $n^+$-type semiconductor region 30b in contact with the conductor portions 7c.

At a second position where the floating electrode FG two-dimensionally overlaps the active region L3 of the p-type well HPW3, the data read element QR is arranged. The read element QR has a gate electrode FGR, a gate insulating film 10b, and a pair of n-type semiconductor regions 12. The channel of the read element QR is formed in an layer in the upper portion of the p-type well HPW3 where the gate electrode FGR and the active region L3 two-dimensionally overlap each other.

The gate electrode FGR is formed of a part of the floating electrode FG. The gate insulating film 10b is made of, e.g., silicon dioxide, and formed between the gate electrode FGR and the substrate 1S (p-type well HPW3). The thickness of the gate insulating film 10b is on the order of, e.g., 13.5 nm. The pair of n-type semiconductor regions 12 of the read element QR are formed at positions sandwiching the gate electrode FGR therebetween in the p-type well HPW3 by self alignment with respect to the gate electrode FGR. The pair of n-type semiconductor regions 12 of the data read element QR have respective channel-side $n^-$-type semiconductor regions 12a, and respective $n^+$-type semiconductor regions 12b coupled to the respective channel-side $n^-$-type semiconductor regions 12a. Each of the $n^-$-type semiconductor regions 12a and the $n^+$-type semiconductor regions 12b contains an impurity of the same conductivity type such as, e.g., phosphorus (P) or arsenic (As), but the impurity concentration of the $n^-$-type semiconductor region 12b is set to be higher than that of the $n^-$-type semiconductor region 12a.

One of the semiconductor regions 12 of the read element QR thus described is electrically coupled to conductor portions 7d in the contact holes CT formed in the insulating layer 6. The conductor portions 7b are electrically coupled to a source line SL. The silicide layer 5a may also be formed in a part of the top surface of the $n^+$-type semiconductor region 12b in contact with the conductor portions 7b. The other of the semiconductor regions 12 of the read element QR is commonly used also as one of the source/drain n-type semiconductor regions 12 of a select MIS transistor QS.

The select MIS transistors QS has a gate electrode FGS, a gate insulating film 10e, and the pair of source/drain n-type semiconductor regions 12. The channel of the select MIS transistor QS is formed in a layer in the upper portion of the p-type well HPW3 where the gate electrode FGS and the active region L3 two-dimensionally overlap each other.

The gate electrode FGS is made of, e.g., high-resistance polysilicon, and electrically isolated from the floating electrode FG. The gate electrode FGS is electrically coupled to conductor portions 7f in the contact holes CT formed in the insulating layer 6. The contact holes CT are shown in FIG. 4 for easy illustration, though they are not to be shown in the cross section of FIG. 4 taken along the line X1-X1 of FIG. 3. The conductor portions 7f are each electrically coupled to a select line GS.

The gate insulating film 10e is made of, e.g., silicon dioxide, and formed between the gate electrode FGS and the substrate 1S (p-type well HPW3). The thickness of the gate insulating film 10e is on the order of, e.g., 13.5 nm. The structure of each of the pair of n-type semiconductor regions 12 of the select MIS transistor is the same as that of the n-type semiconductor region 12 of the read element QR. The other n-type semiconductor region 12 of the select MIS transistor QS is electrically coupled to conductor portions 7g in the contact holes CT formed in the insulating layer 6. The conductor portions 7g are electrically coupled to data read bit lines RBL. The silicide layer 5a may also be formed in a part of the top surface of the $n^+$-type semiconductor region 12b in contact with the conductor portions 7g.

At a position where the floating electrode FG two-dimensionally overlaps the p-type well HPW1, the capacitor element C is formed. The capacitor element C has a control gate electrode CGW, a capacitor electrode FGC2, a capacitor insulating film 10c, a p-type semiconductor region 13, and the p-type well HPW1.

The capacitor electrode FGC2 is a portion formed of a part of the floating electrode FG opposing the control gate electrode CGW, and forming one of the electrodes of the capacitor element C. By thus forming the gate of the memory cell MC in a single-layer structure, easy matching from a manufacturing viewpoint is allowed between the memory cell MC of the nonvolatile memory and the elements of the main circuit. This allows a reduction in the manufacturing time of the semiconductor device, and a reduction in manufacturing cost.

The capacitor electrode FGC2 is formed such that the length thereof in the second direction X is larger than the respective lengths of the capacitor electrode FGC1 of the write/erase element CWE in the second direction X and the gate electrode FGR of the read element QR in the second direction X. That is, the length of the capacitor electrode FGC2 of the floating electrode FG in the second direction X intersecting the first direction Y is larger than the respective lengths of the capacitor electrode FGC1 in the second direction X and the gate electrode FGR in the second direction X. As a result, it is possible to ensure a large plan area for the capacitor electrode FGC2, and therefore increase a coupling ratio as well as improve the efficiency of voltage supply from a control gate line CG.

As shown in FIG. 3, the floating electrode FG is arranged to extend from one end side of the capacitor electrode FGC2 to the capacitor electrode FGC1 and the gate electrode FGR, and has a flag-like plan configuration. On the other hand, the gate electrode FGS of the select MIS transistor QR is arranged on the other end side of the capacitor electrode FGC2 to two-dimensionally overlap the well active region L3. That is, the respective plan areas of the capacitor electrode FGC1 and the gate electrode FGR are each different from the plan area of the capacitor electrode FGC2 and, because of the different plan areas, the gate electrode FGS is arranged in a region where the floating electrode FG is absent. By contrast, in the case where, e.g., the floating electrode FG is arranged to extend from the center portion of the capacitor electrode FGC2 to the capacitor electrode FGC1 and the gate electrode FGR to have a T-shaped plan configuration, the gate electrode FGS may have to be arranged in another region. However, since the present first embodiment has arranged the gate electrode FGS in the region where the flag-like floating electrode FG is absent, the chip area can be reduced.

The capacitor insulating film 10c is made of, e.g., silicon dioxide, and formed between the capacitor electrode FGC2 and the substrate 1S (p-type well HPW1). The capacitance insulating film 10c is formed simultaneously by a thermal oxidation step for forming the gate insulating films 10b and 10e, and the capacitor insulating film 10d. The thickness of the capacitor insulating film 10c is on the order of, e.g., 13.5 nm.

A pair of the p-type semiconductor region 13 and an n-type semiconductor region 31 of the capacitor element C are formed at positions sandwiching the capacitor electrode FGC2 therebetween in the p-type well HPW1 by self alignment with respect to the capacitor electrode FGC2. The p-type semiconductor region 13, the n-type semiconductor region 31, and the p-type well HPW1 are portions each forming one of the electrodes of the capacitor element C. That is, in the capacitor element C, the conductivity types of the semiconductor regions on the left and right sides of the capacitor electrode FGC2 are asymmetric. With such a structure, it is possible to suppress or prevent the formation of a depletion layer in the substrate 1S during the erasing or writing of data.

The semiconductor region 13 has a channel-side $p^-$-type semiconductor region 13a, and a $p^+$-type semiconductor region 13b electrically coupled to the semiconductor region 13a. Each of the $p^-$-type semiconductor region 13a and the $p^+$-type semiconductor region 13b contains an impurity of the same conductivity type such as, e.g., boron (B), but the impurity concentration of the $p^+$-type semiconductor region 13b is set to be higher than that of the $p^-$-type semiconductor region 13a. The p-type semiconductor region 13 is electrically coupled to the p-type well HPW1.

On the other hand, the n-type semiconductor region 31 has a channel-side $n^-$-type semiconductor region 31a, and an $n^+$-type semiconductor region 31b electrically coupled to the $n^-$-type semiconductor region 31a. Each of the $n^-$-type semiconductor region 31a and the $n^+$-type semiconductor region 31b contains an impurity of the same conductivity type such as, e.g., phosphorus (P) or arsenic (As), but the impurity concentration of the $n^+$-type semiconductor region 31b is set to be higher than that of the $n^-$-type semiconductor region 31a.

Each of the $p^-$-type semiconductor region 13a and the $n^-$-type semiconductor region 31a extends from around one of the end portions of the capacitor electrode FGC2 along the principal surface of the substrate 1S by a distance nearly equivalent to the width of each of the sidewalls SW to terminate. The $p^-$-type semiconductor region 13a and the $n^-$-type semiconductor region 31a partly overlap at the respective terminal ends thereof, and extend from the overlap position along the principal surface of the substrate 1S by a desired length to terminate at the isolation portion TI.

In the present first embodiment, the n-type semiconductor region 31 is formed between the two mutually adjacent floating electrodes FG, as shown in FIG. 3. That is, the n-type semiconductor region 31 serves as a common region between the two capacitor elements C, as shown in FIG. 3. As shown in FIGS. 1 to 3, the capacitor elements C each not configuring the memory cell MC are arranged outside the nonvolatile memory region.

The p-type semiconductor region 13 and the n-type semiconductor region 31 are electrically coupled to conductor portions 7e in the contact holes CT formed in the insulating layer 6. The conductor portions 7e are electrically coupled to the control gate lines CG. The silicide layer 5a may also be formed in a part of the top surface of each of the $p^-$-type semiconductor region 13*b* and the n⁺-type semiconductor region 31*b* in contact with the conductor portions 7*c*.

Thus, in the present first embodiment, among the plurality of memory cells MC formed on the principal surface of the substrate 1S, the memory cells MC1 and MC2 arranged adjacent to each other in the first direction Y have the respective write/erase elements CWE formed in the common active region L2 so that the respective read elements QR thereof are formed in the common active region L3.

Figure 5:
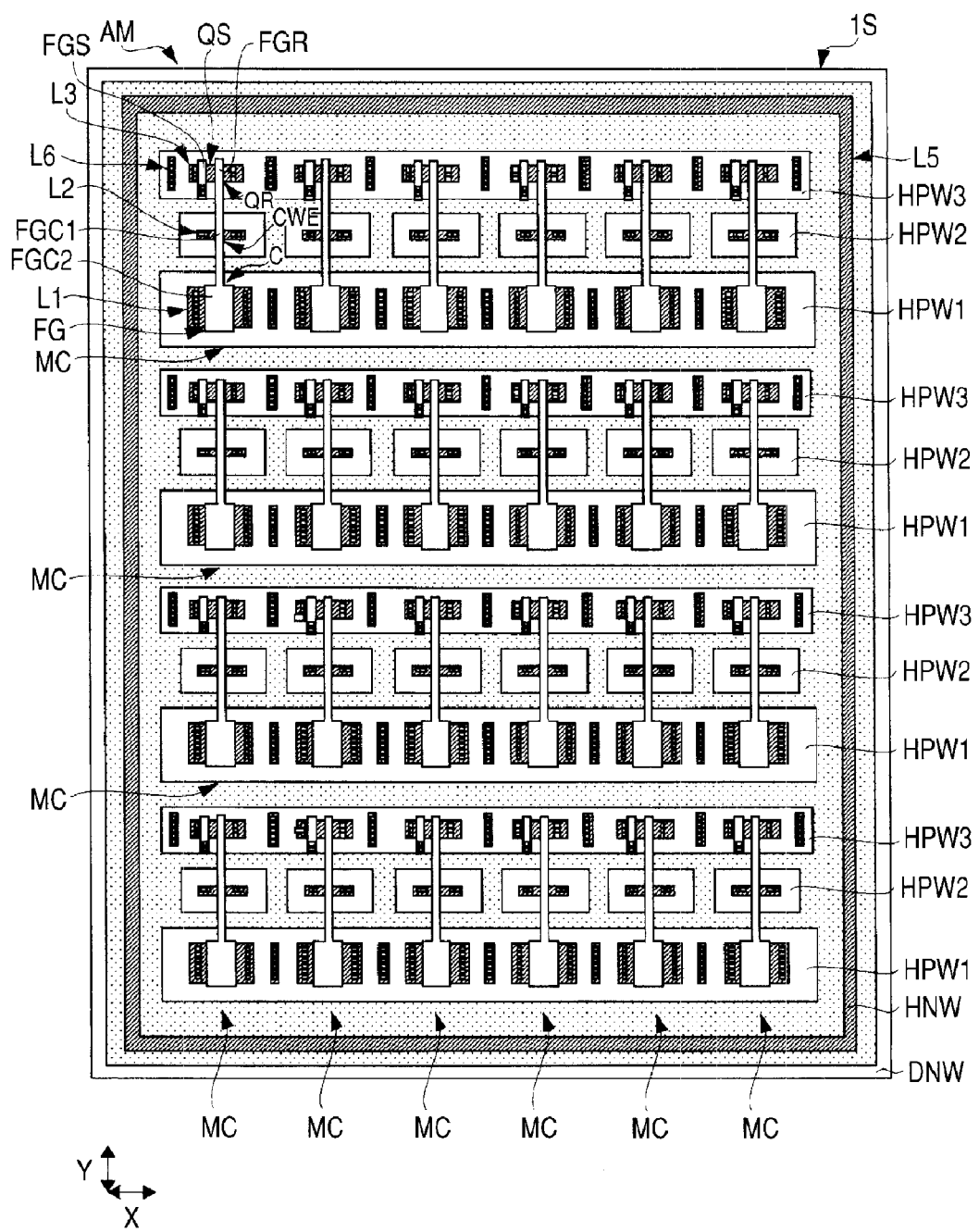
FIG. 5 is a plan view of the 24-bit nonvolatile memory arranged in the nonvolatile memory region, which has been examined by the present inventors.

FIG. 5 shows a plan view of a 24-bit nonvolatile memory using the memory cells MC according to the first embodiment, which are arranged differently from the memory cells MC shown in FIGS. 1 to 3. In the nonvolatile memory of FIG. 5, among the plurality of memory cells MC, the memory cells MC arranged adjacent to each other have the respective write/erase elements CWE formed in the different active regions L2, and have the respective write/erase elements QR formed in the different active regions L3, unlike in the non-volatile memory shown in FIGS. 1 to 3. That is, the capacitor element C forming one of the memory cells is formed in the first active region L1, the write/erase element CWE forming the memory cell is formed in the active region L2, and the read element QR forming the memory cell is formed in the active region L3, each in a one-to-one correspondence.

In contrast to the arrangement of the memory cells in the nonvolatile memory shown in FIG. 5, the arrangement of the memory cells in the nonvolatile memory according to the present first embodiment is such that the respective write/erase elements CWE of the two memory cells MC1 and MC2 arranged adjacent to each other in the first direction Y are formed in the common active region L2, and the respective read elements QR thereof are formed in the common active region L3, as described above. This allows a reduction in the area occupied by the p-type wells HPW2 and HPW3 in the nonvolatile memory region. For example, when a comparison is made between a 24-bit nonvolatile memory having the arrangement of FIG. 1 and a 24-bit nonvolatile memory having the arrangement of FIG. 5, the nonvolatile memory region of the 24-bit nonvolatile memory having the arrangement of FIG. 1 can be reduced to about 70% of that of the nonvolatile memory region shown in FIG. 5. By reducing the nonvolatile memory region, the area of the entire chip can further be reduced.

Next, a description will be given of an example of an operation of the nonvolatile memory according to the present first embodiment, which is represented herein by the 8-bit nonvolatile memory shown in FIG. 2, with reference to FIGS. 6 to 9. In FIGS. 6 to 9, the coupling between the individual components of the nonvolatile memory (hereinafter referred to as a memory array) shown in FIG. 2 are indicated by the dots and the lines. In the memory array, the plurality of data write/erase bit lines WBL (WBL0, WBL1, ...), and the plurality of data read bit lines RBL (RBL0, RBL1, ...), each extending in the first direction Y, are arranged along the second direction X. Additionally, in the memory array, the plurality of control gate lines (word lines) CG (CG0, CG1, ...), the plurality of source lines SL, and the plurality of select lines GS, each extending along the second direction X orthogonal to the bit lines WBL and RBL, are arranged along the first direction Y.

The data write/erase bit lines WBL are each electrically coupled to an inverter circuit for inputting data (0/1) arranged in the peripheral region of the memory array. On the other hand, the data read bit lines RBL are each electrically coupled to a sense amplifier circuit arranged in the peripheral circuit region mentioned above. The sense amplifier circuit has, e.g., a current mirror configuration. In the vicinity of the grid-like points of intersection between these bit lines WBL and RBL and the control gate lines CG, the source lines SL, and the select lines GS, the memory cells MC each corresponding to one bit are electrically coupled. In the case illustrated herein, one bit is formed of one of the memory cells MC.

Each of the memory cells MC has the data write/erase element CWE formed of the capacitor element (charge injection/emission portion), the data read element QR, the capacitor element C, and the select MIS transistor QS. One of the electrodes of the data write/erase element CWE is electrically coupled to the corresponding data write/erase bit line WBL. The other electrode (floating electrode FG) of the data write/erase element CWE is electrically coupled to the gate electrode (floating electrode FG) of the data read element QR, and also electrically coupled to one (floating electrode FG) of the electrodes of the capacitor element C. The other electrode (control gate electrode CGW shown in FIG. 4) of the capacitor element C is electrically coupled to the corresponding control gate line CG. On the other hand, the drain of the data read element QR is electrically coupled to the data read bit line RBL via the select MIS transistor QS, while the source thereof is electrically coupled to the corresponding source line SL. The gate electrode of the select MIS transistor QS is electrically coupled to the select line GS.

Figure 6:
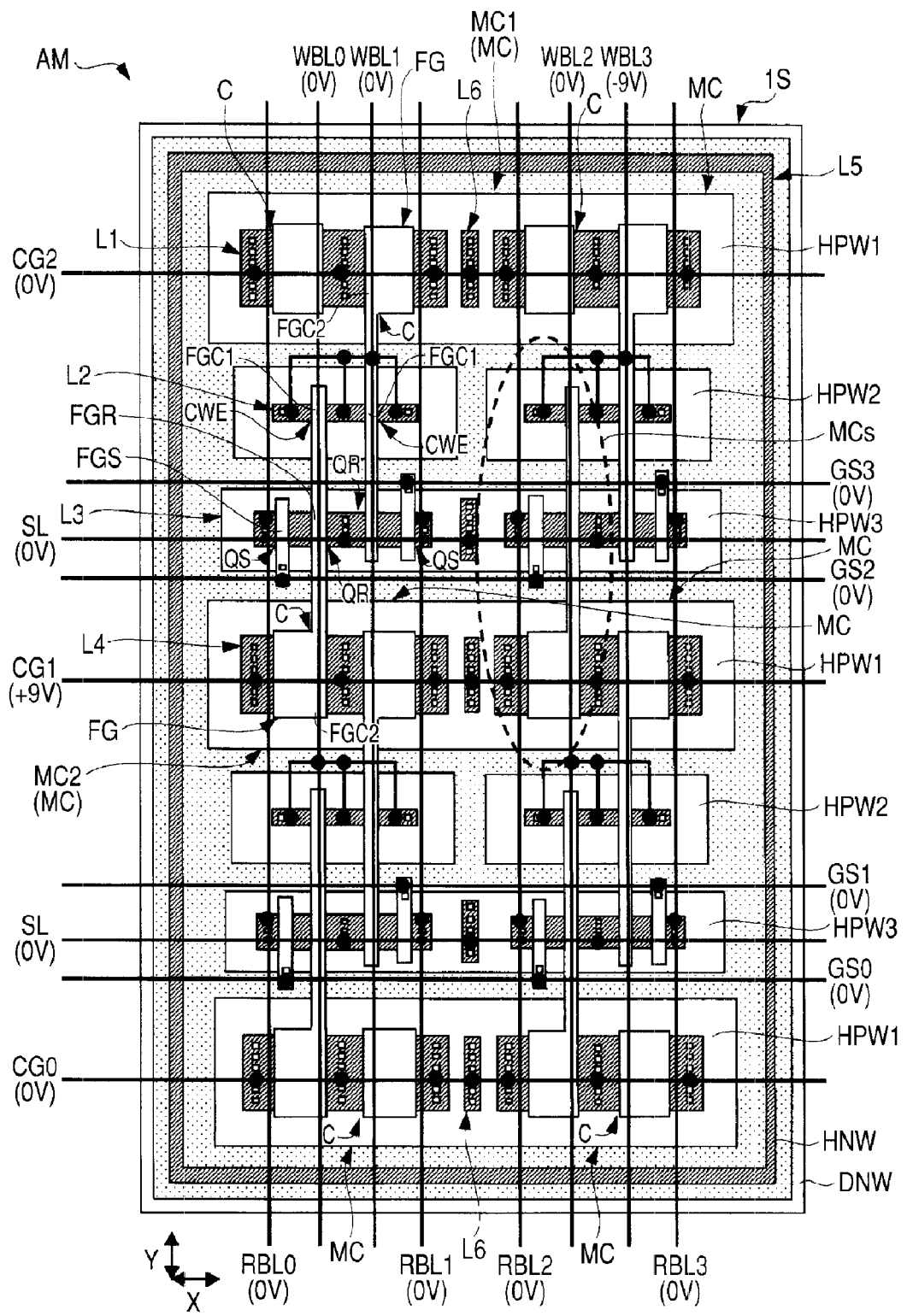
FIG. 6 is an illustrative view of a data write operation in the nonvolatile memory of FIG. 2.

An example of a data write operation in the memory array having such connection will be described with reference to FIG. 6. In FIG. 6, the memory cell MC as a data write target (hereinafter referred to as a selected memory cell MCs) is indicated by the broken line, and voltages applied to the individual components during the data write operation to the nonvolatile memory are shown. Although injection of electrons into the floating gate electrode is defined herein as data writing, it is also possible to conversely define extraction of electrons from the floating gate electrode as data writing.

During data writing, a positive control voltage of, e.g., 9 V is applied to the control gate line CG1 coupled to the other electrode of the capacitor element C of the selected memory cell MCs. To each of the other control gate lines CG, a voltage of, e.g., 0 V is applied. On the other hand, a negative voltage of, e.g., −9 V is applied to the data bit line WBL3 electrically coupled to one of the electrodes of the data write/erase element CWE of the selected memory cell MCs. To each of the other write/erase bit lines WBL, a voltage of, e.g., 0 V is applied. To each of the select lines GS, the source lines SL, and the data write bit lines RBL, a voltage of, e.g., 0 V is applied. In this manner, the electrons are injected into the floating electrode FG of the data write/erase element CWE of the selected memory cell MCs with the FN tunnel current of the entire surface of the channel.

Thus, in the writing of data in the present first embodiment, the well HPW1 of the capacitor element C is set to 9 V by applying the control voltage of 9 V to the control gate line CG, and the well HPW2 of the write/erase element CWE is set to −9 V by applying the negative voltage of −9 V to the bit line WBL, so that the FN tunnel current is generated with the potential difference of 18 V to perform writing.

A description will be given of voltages applied to the individual components in the data write operation with reference to FIG. 4. To each of the n-type well HNW and the n-type buried well DNW, a voltage of, e.g., 9 V is applied through the conductor portions 7*b* to provide electrical isolation between the substrate 1S and the p-type wells HPW 1 to HPW3. On the other hand, a positive control voltage of, e.g., 9 V is applied to the control gate electrode CGW of the capacitor element C from each of the control gate lines CG through the conductor portions 7*e*. Additionally, a negative voltage of, e.g., −9 V is applied to one of the electrodes (p-type semiconductor region 15 and p-type well HPW2) of the write/erase element CWE from each of the data write/erase bit lines WBL described above through the conductor portions 7c. Moreover, a voltage of, e.g., 0 V is applied to the p-type well HPW3 through the conductor portions 7a. Further, a voltage of, e.g., 0 V is applied from the source line SL to one of the n-type semiconductor regions 12 of the data read element QR through the conductor portions 7d. Furthermore, a voltage of, e.g., 0 V is applied from the data write bit line RBL to one of the n-type semiconductor regions 12 of the select MIS transistor QS through the conductor portions 7g.

In this manner, the electrons in the p-type well HPW2 of the data write/erase element CWE of the selected memory cell MCs are injected into the capacitor electrode FGC1 (floating electrode FG) through the capacitor insulating film 10d with the FN tunnel current of the entire surface of the channel.

Figure 7:
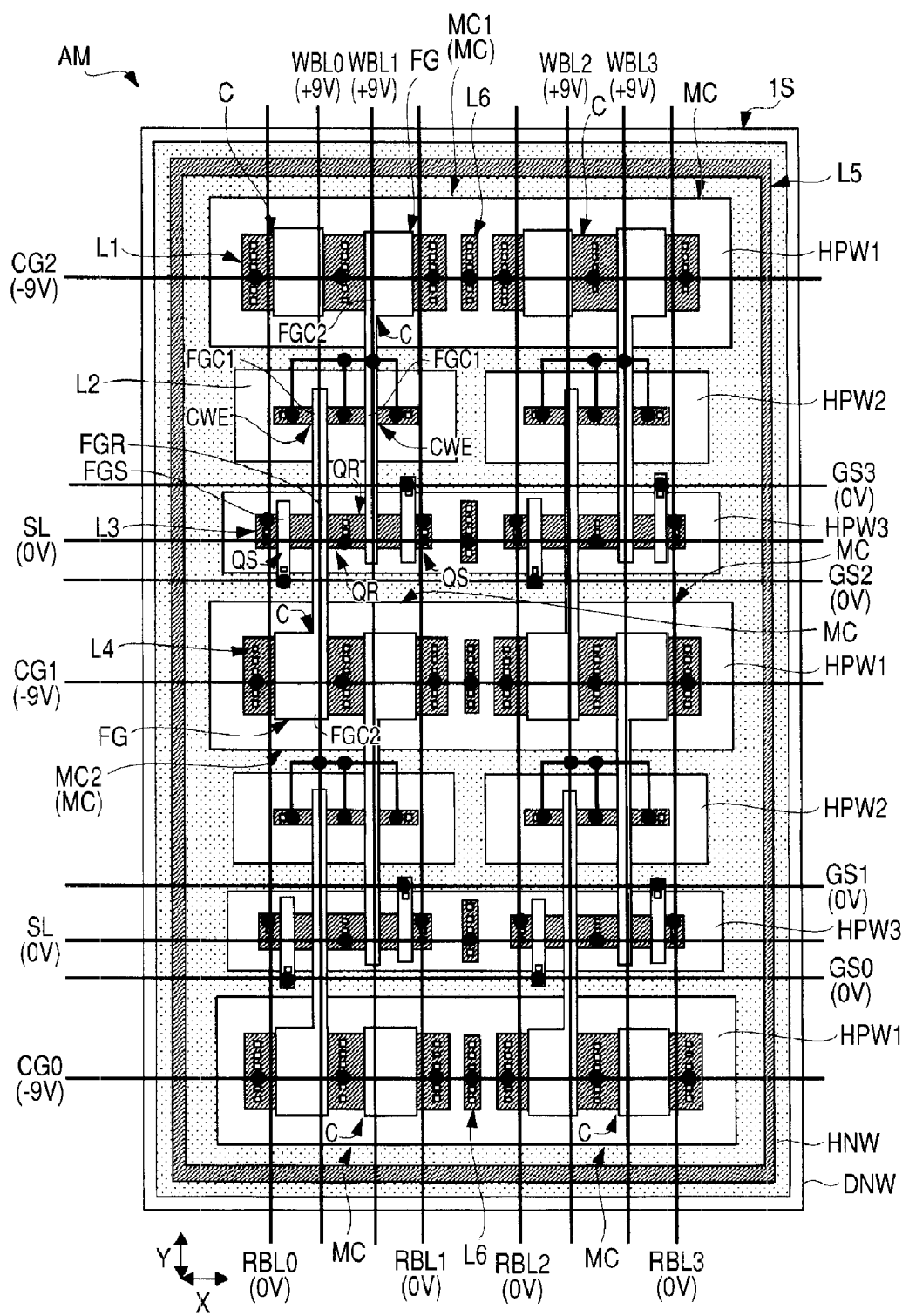
FIG. 7 is an illustrative view of a simultaneous data erase operation in the nonvolatile memory of FIG. 2.

An example of a simultaneous data erase operation will be described with reference to FIG. 7. FIG. 7 shows voltages applied to the individual components during the simultaneous data erase operation. Although extraction of electrons from the floating gate electrode is defined herein as data erasing, it is also possible to conversely define injection of electrons into the floating gate electrode as data erasing.

During simultaneous data erasing, a negative voltage of, e.g., −9 V is applied to each of the control gate lines CG coupled to the other electrodes of the capacitor elements C of the plurality of memory cells MC. On the other hand, a positive voltage of, e.g., 9 V is applied to each of the data write/erase bit lines WBL electrically coupled to ones of the electrodes of the data write/erase elements CWE of the memory cells MC. Additionally, a voltage of, e.g., 0 V is applied to each of the select lines GS, the source lines SL, and the data write bit lines RBL. In this manner, the electrons accumulated in the floating electrodes FG of the data write/erase elements CWE of the plurality of memory cells MC to which simultaneous data erasing is performed are emitted with the FN tunnel currents of the entire surfaces of the channels so that data in the plurality of memory cells MC is simultaneously erased.

Figure 8:
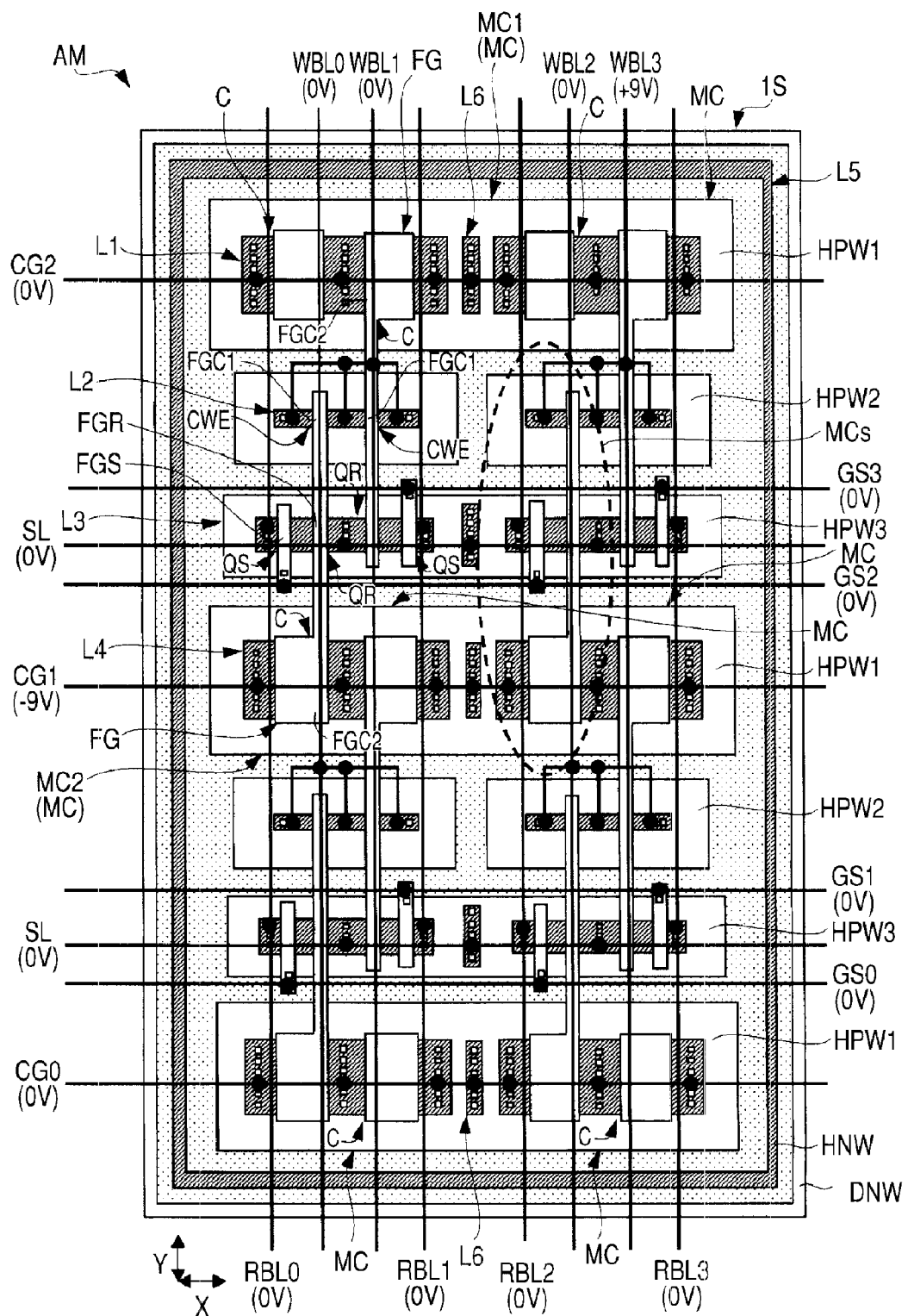
FIG. 8 is an illustrative view of a bitwise erase operation in the nonvolatile memory of FIG. 2.

An example of a bitwise data erase operation will be described with reference to FIG. 8. In FIG. 8, the memory cell MC as a bitwise data erase target (hereinafter referred to as the selected memory cell MCs) is indicated by the broken line, and voltages applied to the individual components during the bitwise data erase operation in the nonvolatile memory are shown.

During bitwise data erasing, a negative control voltage of, e.g., −9 V is applied to the control gate line CG1 coupled to the other electrode of the capacitor element C of the selected memory cell MCs. To each of the other control gate lines CG, a voltage of, e.g., 0 V is applied. On the other hand, a positive voltage of, e.g., 9 V is applied to the data write/erase bit line WBL3 electrically coupled to one of the electrodes of the data write/erase element CWE of the selected memory cell MCs. To each of the other data write/erase bit lines WBL, a voltage of, e.g., 0 V is applied. Additionally, a voltage of, e.g., 0 V is applied to each of the select lines GS, the source lines SL, and the data write bit lines RBL. In this manner, the electrons accumulated in the floating electrode FG of the data write/erase element CWE of the selected memory cell MCs as the data erase target are emitted with the FN tunnel current of the entire surface of the channel so that data in the selected memory cell MCs as the data erase target is erased.

A description will be given of voltages applied to the individual components in a data erase operation with reference to FIG. 4. To each of the n-type well NHW and the n-type buried well DNW, a voltage of, e.g., 9 V is applied through the conductor portions 7b to provide electrical isolation between the substrate 1S and the p-type wells HPW 1 to HPW3. On the other hand, a negative control voltage of, e.g., −9 V is applied to the control gate electrode CGW of the capacitor element C from each of the control gate lines CG through the conductor portions 7e. Additionally, a positive voltage of, e.g., 9 V is applied to one of the electrodes (p-type semiconductor region 15 and p-type well HPW2) of the write/erase element CWE from each of the data write/erase bit lines WBL described above through the conductor portions 7c. Moreover, a voltage of, e.g., 0 V is applied to the p-type well HPW3 through the conductor portions 7a. Further, a voltage of, e.g., 0 V is applied from the select line GS to the gate electrode FGS of the select MIS transistor QS through the conductor portions 7f. Furthermore, a voltage of, e.g., 0 V is applied from the source line SL to one of the n-type semiconductor regions 12 of the data read element QR through the conductor portions 7d. Furthermore, a voltage of, e.g., 0 V is applied from the data write bit line RBL to one of the n-type semiconductor regions 12 of the select MIS transistor QS through the conductor portions 7g.

In this manner, the electrons accumulated in the capacitor electrode FGC1 (floating electrode FG) of the data write/erase element CWE of the selected memory cell MCs are emitted to the p-type well HPW2 through the capacitor insulating film 10d with the FN tunnel current of the entire surface of the channel.

Figure 9:
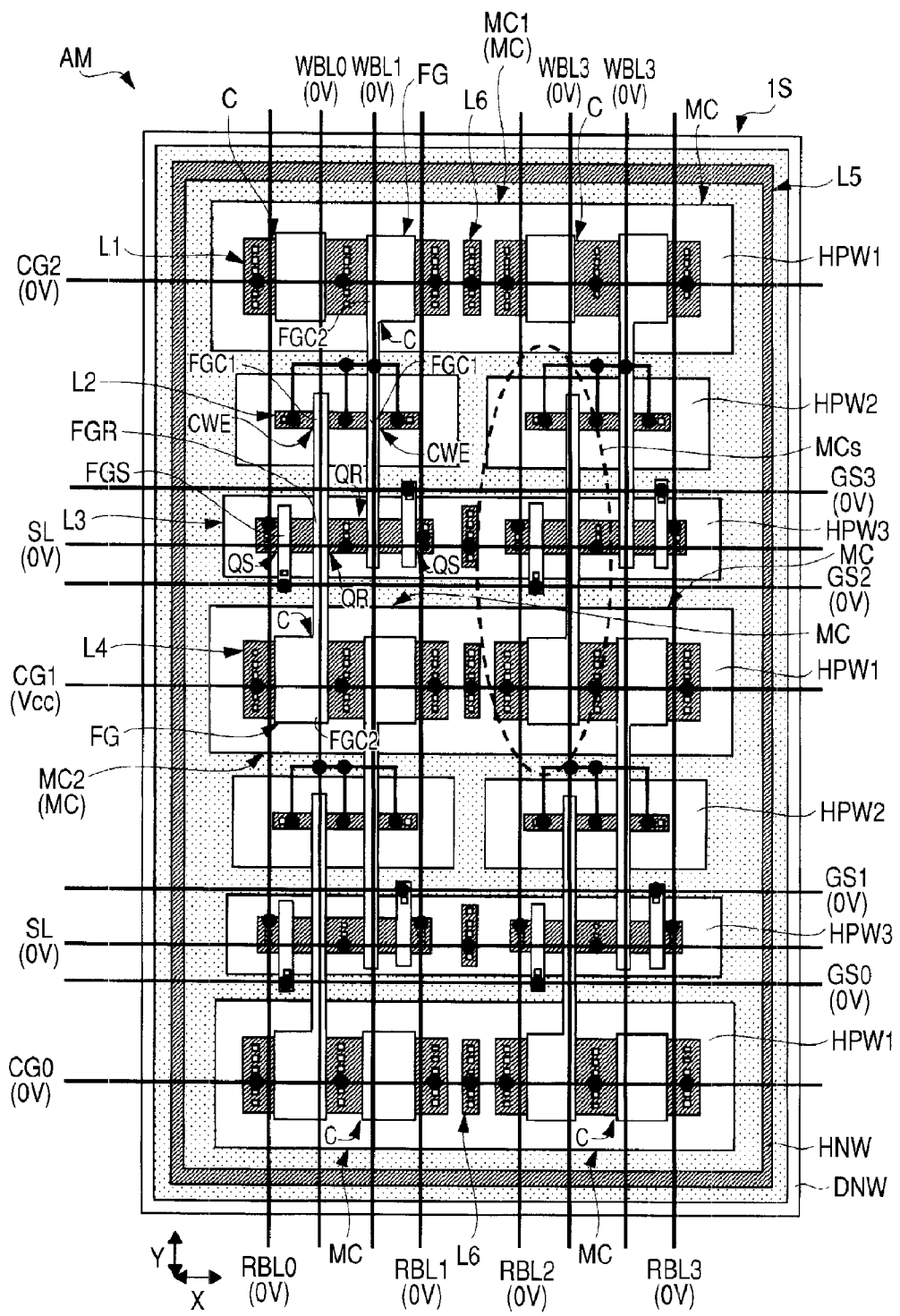
FIG. 9 is an illustrative view of a read operation in the nonvolatile memory of FIG. 2.

An example of a data read operation will be described with reference to FIG. 9. In FIG. 9, the memory cell MC (hereinafter referred to as the selected memory cell MCs) as a data read target is indicated by the broken line, and voltages applied to the individual components during the data read operation to the nonvolatile memory are shown.

During data reading, a control voltage of 3 V is applied from, e.g., a power source Vcc to the control gate line CG1 coupled to the other electrode of the capacitor element C of the selected memory cell MCs. To each of the other control gate lines CG, a voltage of, e.g., 0 V is applied. Additionally, a voltage of, e.g., 0 V is applied to the data write/erase bit line WBL electrically coupled to one of the electrodes of the data write/erase element CWE of the selected memory cell MCs. On the other hand, a voltage of 3 V is applied from, e.g., the power source Vcc to the select line GS2 electrically coupled to the gate electrode of the select MIS transistor QS of the selected memory cell MCs. Then, a voltage of, e.g., 1 V is applied to the data write bit line RBL2. Further, a voltage of, e.g., 0 V is applied to each of the source lines SL. In this manner, the data read element QR of the selected memory cell MCs as a data read target is brought into an ON condition, and data stored in the selected memory cell MCs, which is either 0 or 1 depending on whether or not a drain current flows in the channel of the data read element QR, is read therefrom.

A description will be given of voltages applied to the individual components in the data read operation with reference to FIG. 4. To each of the n-type well NHW and the n-type buried well DNW, a voltage of, e.g., 3 V is applied through the conductor portions 7b to provide electrical isolation between the substrate 1S and the p-type wells HPW 1 to HPW3. Additionally, a positive control voltage of, e.g., 3 V is applied to the control gate electrode CGW of the capacitor element C from each of the control gate lines CG through the conductor portions 7e. In this manner, the positive voltage is applied to the gate electrode FGR of the data read element QR. On the other hand, a voltage of, e.g., 0 V is applied to the p-type well HPW3 through the conductor portions 7a. Additionally, a voltage of, e.g., 3 V is applied from the select line GS to the gate electrode FGS of the select MIS transistor QS through the conductor portions 7*f*. Moreover, a voltage of, e.g., 0 V is applied from the source line SL to one of the n-type semiconductor regions 12 of the data read element QR through the conductor portions 7*d*. Further, a voltage of, e.g., 0 V is applied from the select line GS to the gate electrode FGS of the select MIS transistor QS through the conductor portions 7*f*. Furthermore, a voltage of, e.g., 1 V is applied from the data write bit line RBL to one of the n-type semiconductor regions 12 of the select MIS transistor QS through the conductor portions 7*g*. Furthermore, a voltage of, e.g., 0 V is applied from the data write/erase bit line WBL to one of the electrodes (p-type semiconductor region 15 and p-type well HPW2) of the write/erase element CWE through the conductor portions 7*c*.

In this manner, the data read element QR of the selected memory cell MCr is brought into the ON condition, and data stored in the selected memory cell MCs, which is either 0 or 1 depending on whether or not a drain current flows in the data read element QR, is read therefrom.

According to the present first embodiment, the write/erase element CWE, the data read element QR, and the capacitor element C are formed individually in the different p-type wells HPW1 to HPW3, and isolated from each other with the n-type well HNW and the n-type buried well DNW. Rewriting of data is performed with the capacitor element. Thus, an element for rewriting data is formed of the capacitor element, and the p-type semiconductor region 15 and the p-type well HPW2 are set at equal potentials in the rewriting of data using the FN tunnel current of the entire surface of the channel, so that a problem associated with a junction breakdown voltage does not occur. As a result, it is possible to suppress or prevent the degradation of the memory cells MC of the nonvolatile memory, and improve the reliability of the operation of the nonvolatile memory.

In addition, since data rewriting can be performed with the FN tunnel current of the entire surface of the channel which is smallest in consumed current and suited to a single-power-source rewriting at a low voltage, a single-power-source configuration using an internal voltage boosting circuit can be easily implemented. Moreover, since the FN tunnel current free of production of holes is used for writing and erasing data, the number of times data can be rewritten can be improved.

By individually forming the write/erase element CWE and the data read element QR in the different p-type wells HPW2 and HPW3, stable data rewriting can be performed. This allows an improvement in the reliability of the operation of the nonvolatile memory.

In the memory array according to the present first embodiment, the active regions L1 to L4 are formed in this order to two-dimensionally intersect the bit lines WBL and RBL. As described above, the memory cells MC1 and MC2 arranged adjacent to each other are included in the memory array. In contrast to the memory cell MC1 having the read element QR arranged between the capacitor element C and the write/erase element CWE, the memory cell MC2 has the write/erase element CWE arranged between the capacitor element C and the read element QR. Even when the arrangement of the members configuring the memory cell MC is thus asymmetric, the nonvolatile memory according to the present first embodiment can normally operate.

As shown in FIGS. 6 to 9, in the memory array according to the first embodiment, the active regions L2 are repeatedly arranged to two-dimensionally intersect the data write/erase bit lines WBL. Specifically, the active regions L2 are repeatedly arranged to two-dimensionally intersect the two adjacent bit lines WBL0 and WBL1, and the two adjacent bit lines WBL2 and WBL3.

A description will be given herein of coupling between the plurality of memory cells MC and the plurality of bit lines WBL, e.g., coupling between the bit lines WBL2 and WBL3 and the plurality of active regions L2 arranged along the bit lines WBL2 and WBL3 to two-dimensionally intersect the bit lines WBL2 and WBL3. The bit line WBL2 is electrically coupled to one of the active regions L2 adjacent to each other in the first direction Y in which the write/erase element of the memory cell MC1 is formed, while the bit line WBL3 is electrically coupled to the other of the active regions L2 adjacent to each other in which the write/erase element CWE of the memory cell MC2 is formed. That is, either of the adjacent bit lines WBL2 and WBL3 is electrically coupled to every alternate one of the plurality of active regions L2 arranged along the bit lines WBL2 and WBL3.

If it is assumed that both of the bit lines WBL2 and WBL3 are electrically coupled to each one of the plurality of active regions L2 arranged along the bit lines WBL2 and WBL3, the problem arises that writing is also performed with respect to the memory cells MC other than the selected memory cell MCs as a write target in the data write operation. In the example described above, the positive voltage of 9 V is applied to the control gate line CG1, and the negative voltage of −9 V is applied to the bit line WBL3 so that data is written to the selected memory cell MCs. However, in the case where the bit line WBL3 is electrically coupled to each one of the plurality of active regions L2 arranged along the bit line WBL3, the negative voltage of −9 V is applied also to the active regions L2 arranged with the control gate line CG1 sandwiched therebetween, so that the write operation is performed also to the memory cells MC which are not the write target. To prevent this, in the present first embodiment, either of the adjacent bit lines WBL2 and WBL3 is electrically coupled to every alternate one of the plurality of active regions L2 arranged along the bit line.

Next, a description will be given of an example of a manufacturing method of a semiconductor device in which a nonvolatile memory for storing desired information of a relatively small capacity related to a main circuit is formed on a semiconductor chip formed with an LCD driver circuit (main circuit) with reference to FIGS. 10 to 21.

FIGS. 10 to 21 are cross-sectional views each of a principal portion of the same substrate 1S (which is a semiconductor thin plate having a plan circular configuration termed a semiconductor wafer) in the process steps of manufacturing the semiconductor device according to the present first embodiment 1. A high breakdown voltage portion and a low breakdown voltage portion are regions where the MIS transistors configuring the LCD driver circuit are formed. The operation voltage of the MIS transistor of the high breakdown voltage portion is, e.g., 25 V. The operation voltage of the MIS transistor of the low breakdown voltage portion is, e.g., 6.0 V. Besides the foregoing MIS transistor having the operation voltage of 6.0 V, a MIS transistor having an operation voltage of 1.5 V is also provided in the low breakdown voltage portion. The MIS transistor having the operation voltage of 1.5 V is provided to operate at a speed higher than the speed of the MIS transistor having the operation voltage of 6.0 V, and includes the LCD driver circuit mentioned above in conjunction with the other MIS transistors. The MIS transistor having the operation voltage of 1.5 V has a gate insulating film with a thickness in the range of about 1 to 3 nm, which is smaller than the thickness of the gate insulating film of the MIS transistor having the operation voltage of 6.0 V. In the drawings and the body of the specification mentioned hereinafter, the MIS transistor of the high breakdown voltage portion which has the operation voltage of 25 V, and the MIS transistor of the low breakdown voltage portion which has the operation voltage of 6.0 V are primarily shown for simpler illustration, while the MIS transistor having the operation voltage of 1.5 V is not shown. To the semiconductor device (semiconductor chip, and substrate 1S) according to the present first embodiment also, power is supplied externally from a single power source.

Figure 10:
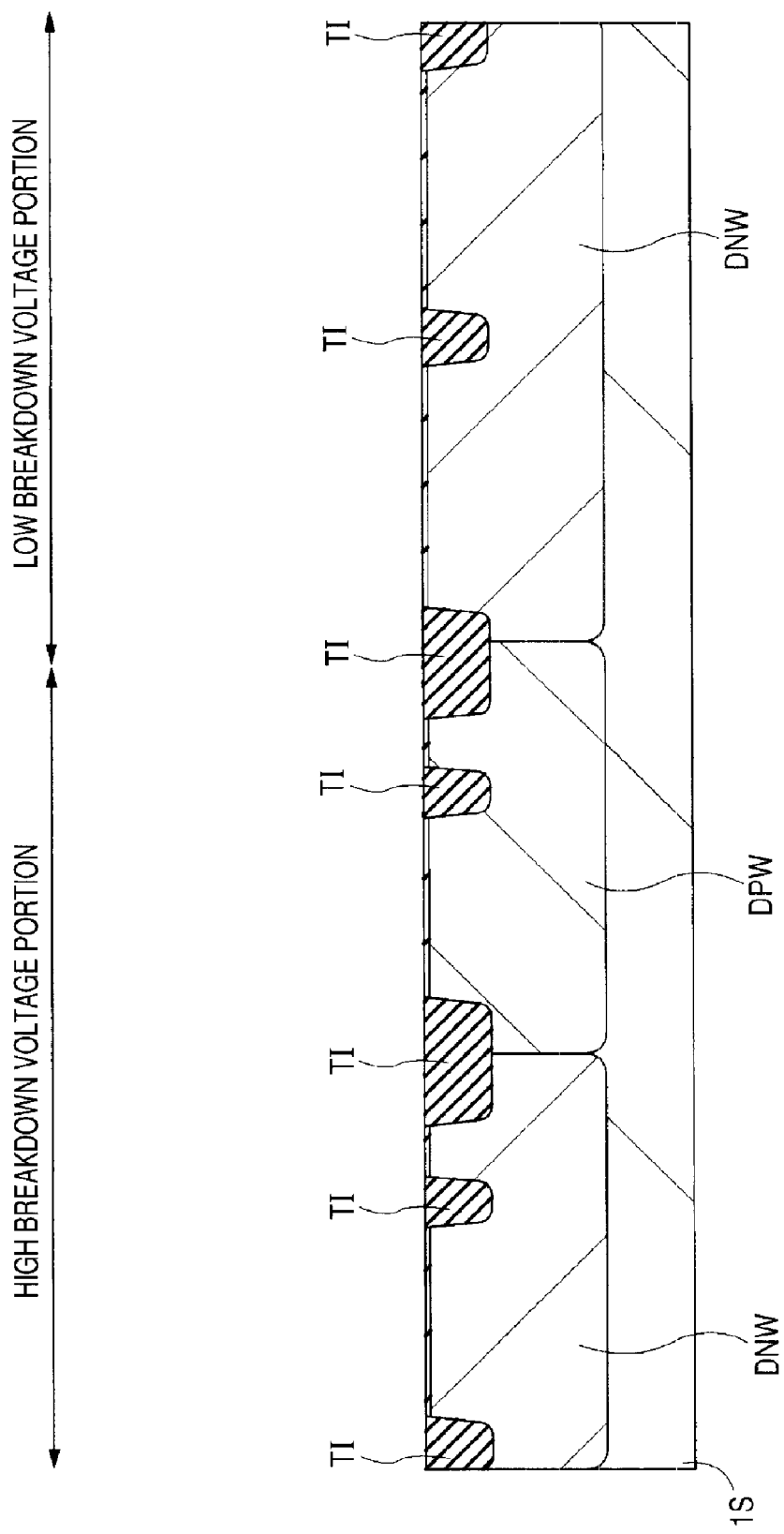
FIG. 10 is a cross-sectional view of a principal portion of a semiconductor substrate in a main circuit region in a process step of manufacturing the semiconductor device in the first embodiment.
Figure 11:
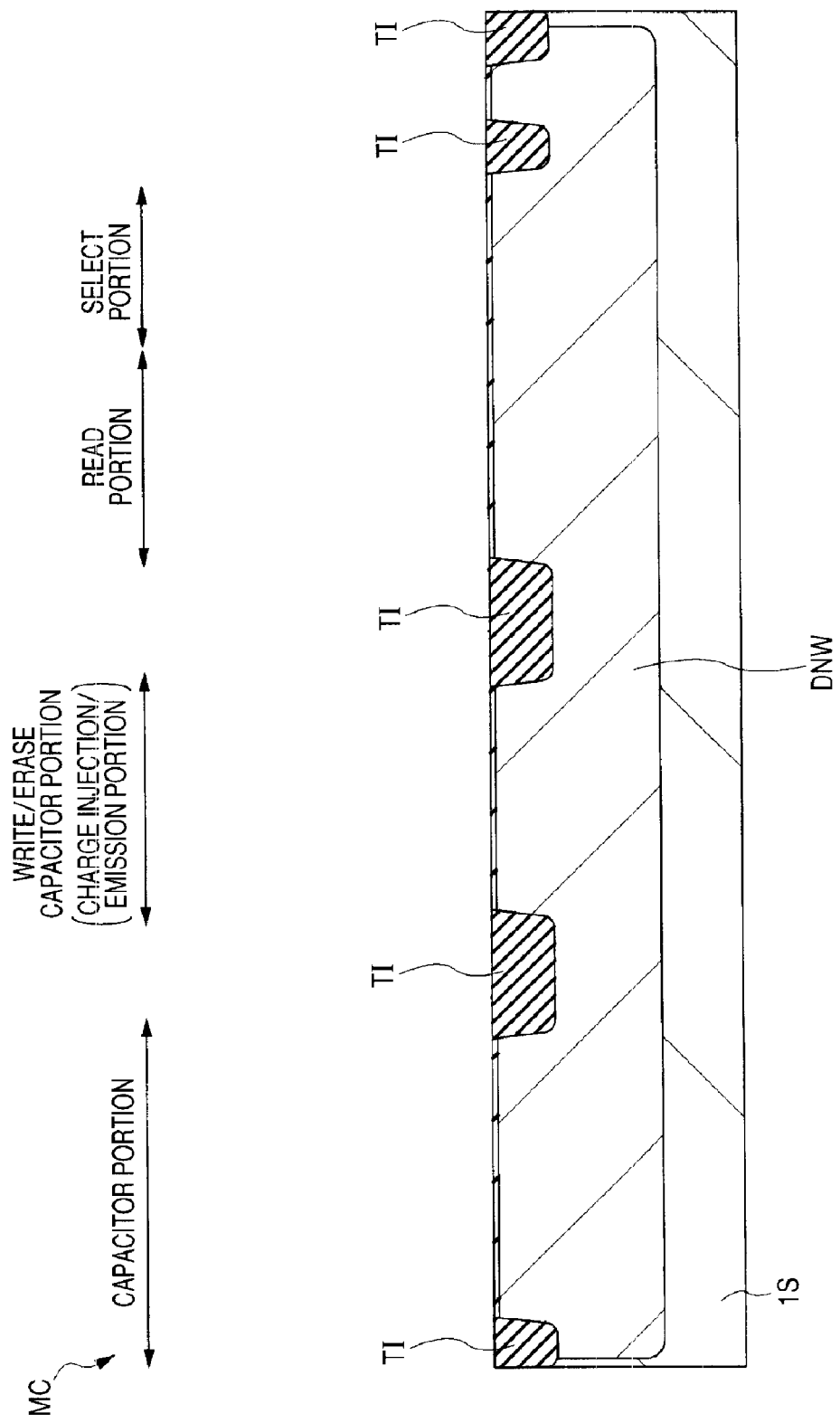
FIG. 11 is a cross-sectional view of the principal portion of the semiconductor substrate in a nonvolatile memory region in the same process step as shown in FIG. 10.

First, as shown in FIGS. 10 and 11, the p-type substrate 1S (semiconductor wafer) is prepared, and the p-type buried well DPW is formed in the high breakdown voltage portion thereof by a photolithographic (hereinafter simply referred to as lithography) step, an ion implantation step, and the like. The lithographic step includes a sequence of steps of coating a photoresist (hereinafter simply referred to as a resist) film, exposing the resist to light, developing it, and the like to form a desired resist pattern. In the step of ion implantation, a desired impurity is selectively introduced into a desired part of the substrate 1S using, as a mask, the resist pattern formed on the principal surface of the substrate 1S through the lithographic step. The resist pattern used herein is a pattern which exposes the region into which the impurity is introduced, and cover the region other than the exposed region.

Subsequently, the n-type buried well DNW is formed simultaneously in the high breakdown voltage portion, the low breakdown voltage portion, and the region where the memory cell of the nonvolatile memory is to be formed by a lithographic step, an ion implantation step, and the like. Thereafter, an isolation trench is formed in the isolation region of the principal surface of the substrate 1S, and a trench isolation portion T1 is formed by burying an insulating film in the isolation trench, whereby the active regions are defined.

Figure 12:
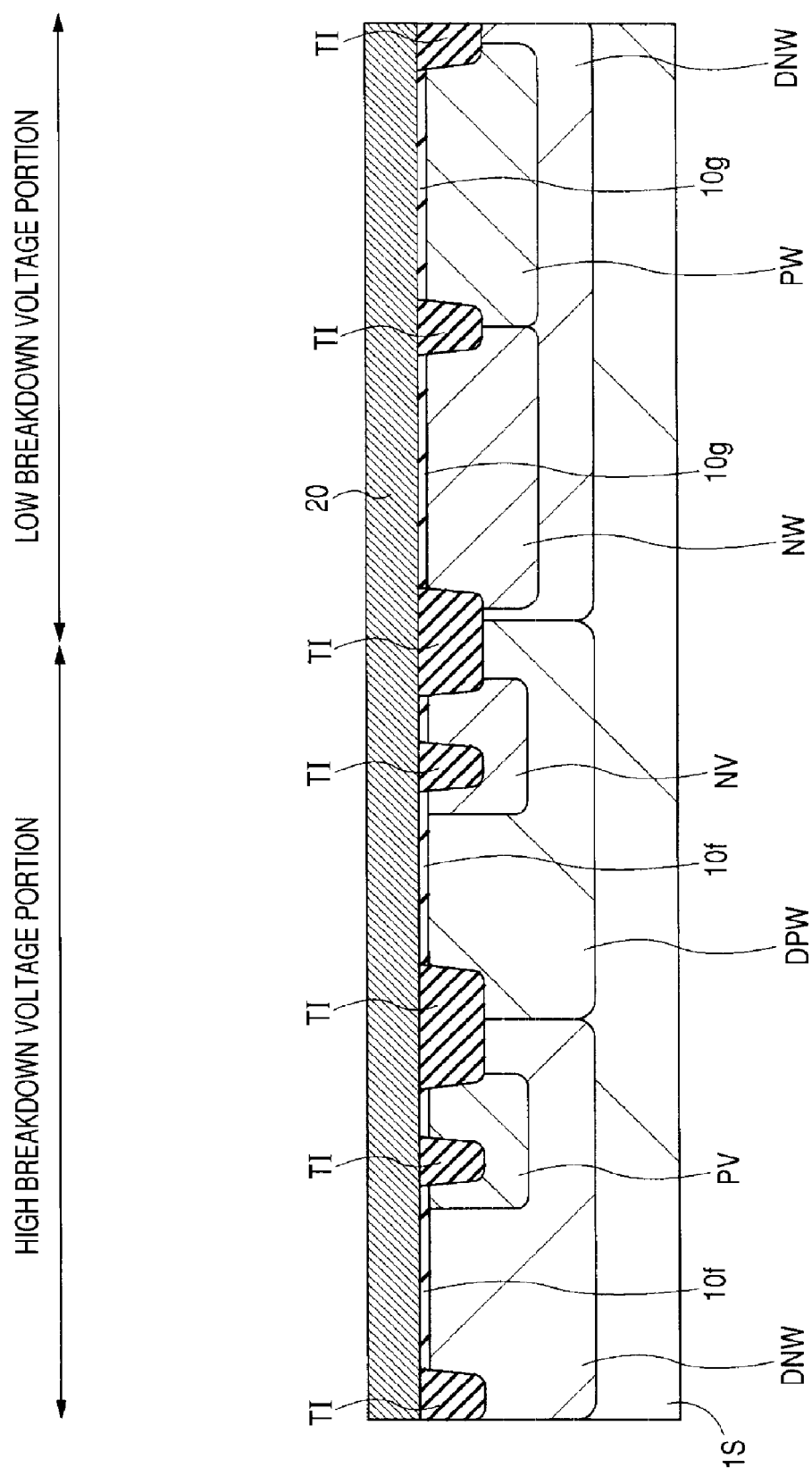
FIG. 12 is a cross-sectional view of the principal portion of the semiconductor substrate in the main circuit region in a process step of manufacturing the semiconductor device, which is subsequent to the process steps shown in FIGS. 10 and 11.
Figure 13:
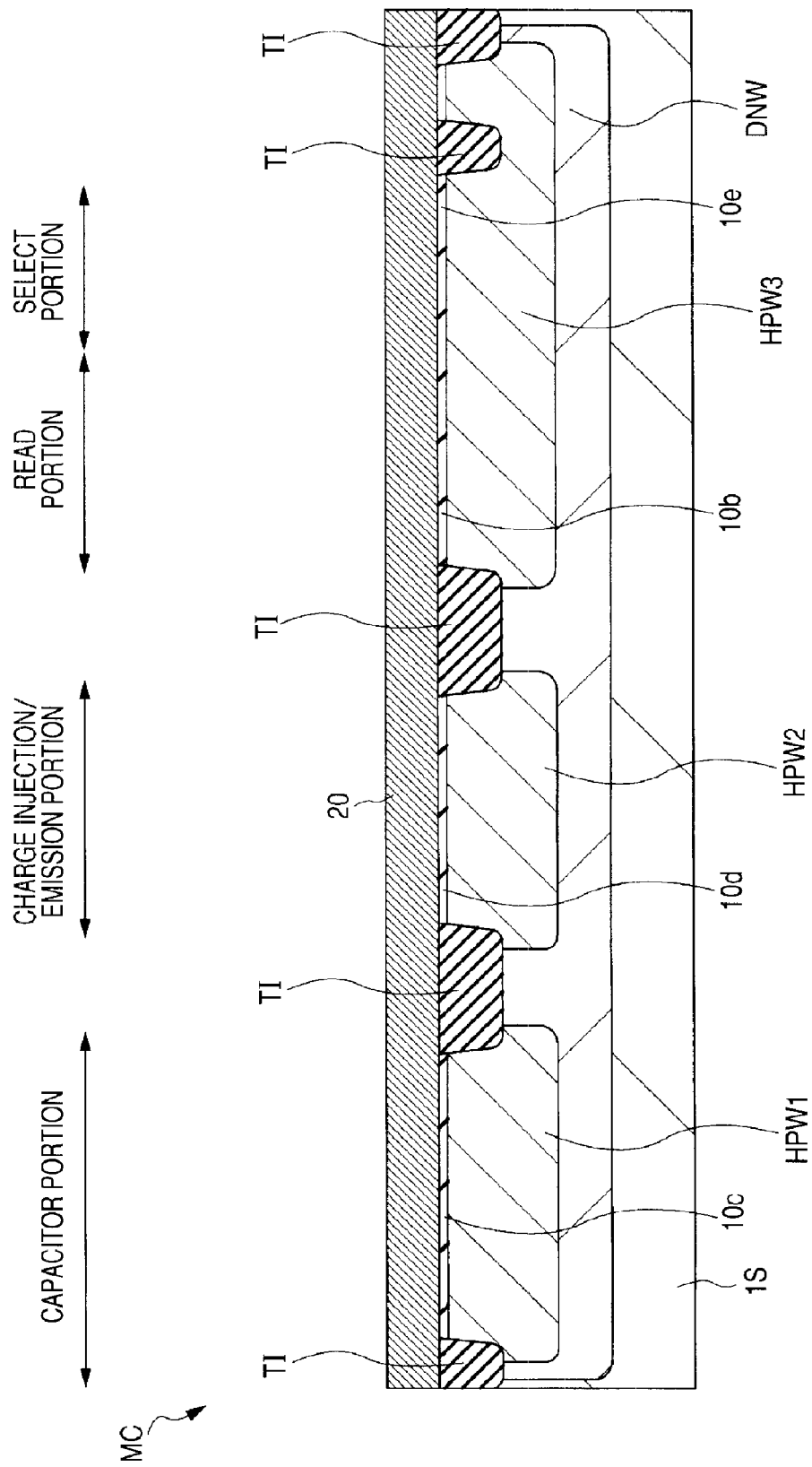
FIG. 13 is a cross-sectional view of the principal portion of the semiconductor substrate in the nonvolatile memory region in the same process step as shown in FIG. 12.

Then, as shown in FIGS. 12 and 13, an n-type semiconductor region NV is formed in the region where the n-channel MIS transistor of the high breakdown voltage portion is to be formed by a lithographic step, an ion implantation step, and the like. The n-type semiconductor region NV has an impurity concentration higher than that of the n-type buried well DNW. Subsequently, a p-type semiconductor region PV is formed in the region where the p-channel MIS transistor of the high breakdown voltage portion is to be formed by a lithographic step, an ion implantation step, and the like. The p-type semiconductor region PV has an impurity concentration higher than that of the p-type buried well DPW.

Subsequently, a p-type well PW is formed in the region where the n-channel MIS transistor of the low breakdown voltage portion is to be formed by a lithographic step, an ion implantation step, and the like. The n-type well PW is a region having an impurity concentration higher than that of each of the p-type buried well DPW and the p-type semiconductor region PV. Subsequently, an n-type well NW is formed in the region where the p-channel MIS transistor of the low breakdown voltage portion is to be formed by a lithographic step, an ion implantation step, and the like. The p-type well NW is a region having an impurity concentration higher than that of each of the n-type buried well DNW and the n-type semiconductor region NV.

Subsequently, the p-type wells HPW1 to HPW3 are formed simultaneously in the region where the memory cell of the nonvolatile memory is formed by a lithographic step, an ion implantation step, and the like. The p-type wells TPW1 to HPW3 are regions each having an impurity concentration higher than that of the p-type buried well DPW, and nearly equal to the impurity concentration of the p-type semiconductor region PV.

The ordering relations among the n-type buried well DNW, the p-type buried well DPW, the n-type semiconductor region NV, the p-type semiconductor region PV, the n-type well NW, the p-type well PW, and the p-type wells HPW to HPW 3 are also the same in each of the embodiments described later.

Then, after the gate insulating films 10$b$, 10$e$, 10$f$, and 10$g$, and the capacitor insulating films 10$c$ and 10$d$ are formed by a thermal oxidation method or the like, a conductor film 20 made of, e.g., low-resistance polysilicon is formed on the principal surface of the substrate 1S (semiconductor wafer) by a CVD (Chemical Vapor Deposition) method or the like. At this time, the gate insulating film 10$f$ of the MIS transistor of the high breakdown voltage portion is formed of a gate insulating film thicker than the gate insulating film 10$g$ of the MIS transistor of the low breakdown voltage portion to withstand a breakdown voltage of 25 V. The thickness of the gate insulating film 10$f$ of the MIS transistor of the high breakdown voltage portion is in a range of, e.g., 50 to 100 nm. Besides the oxide film formed by the thermal oxidation method described above, an insulating film deposited by a CVD method or the like may also be laminated.

The gate insulating films 10$b$ and 10$e$, and the capacitor insulating films 10$c$ and 10$d$ of the nonvolatile memory are formed by the same step of forming the gate insulating film 10$g$ of the MIS transistor (which is the MIS transistor having an operation voltage of, e.g., 6.0 V) of the low breakdown voltage portion. The gate insulating films 10$b$ and 10$e$, and the capacitor insulating films 10$c$ and 10$d$ are formed to have the same thickness as that of the gate insulating film 10$g$ of the MIS transistor of the low breakdown voltage portion.

Figure 14:
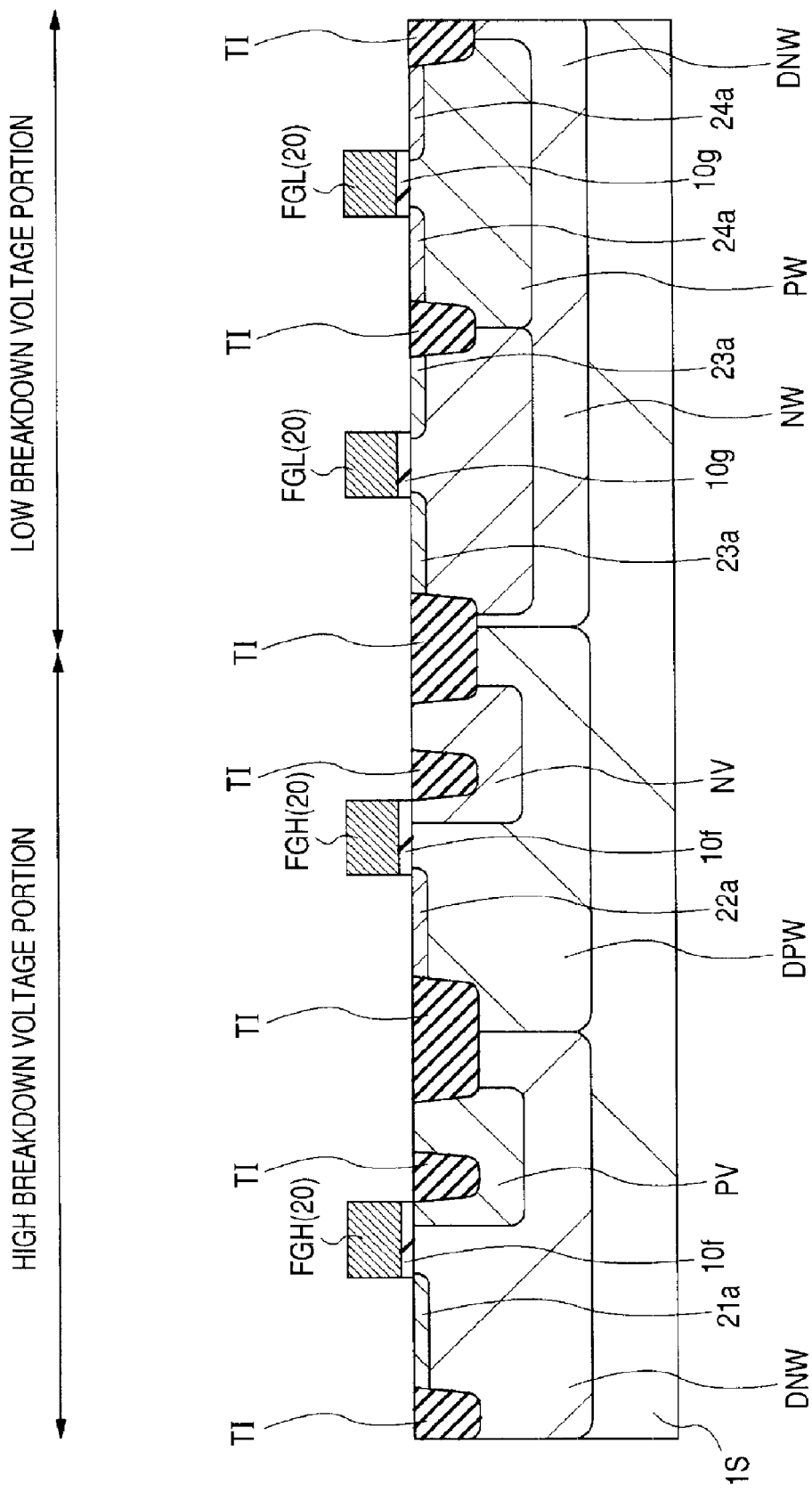
FIG. 14 is a cross-sectional view of the principal portion of the semiconductor substrate in the main circuit region in a process step of manufacturing the semiconductor device, which is subsequent to the process steps shown in FIGS. 12 and 13.
Figure 15:
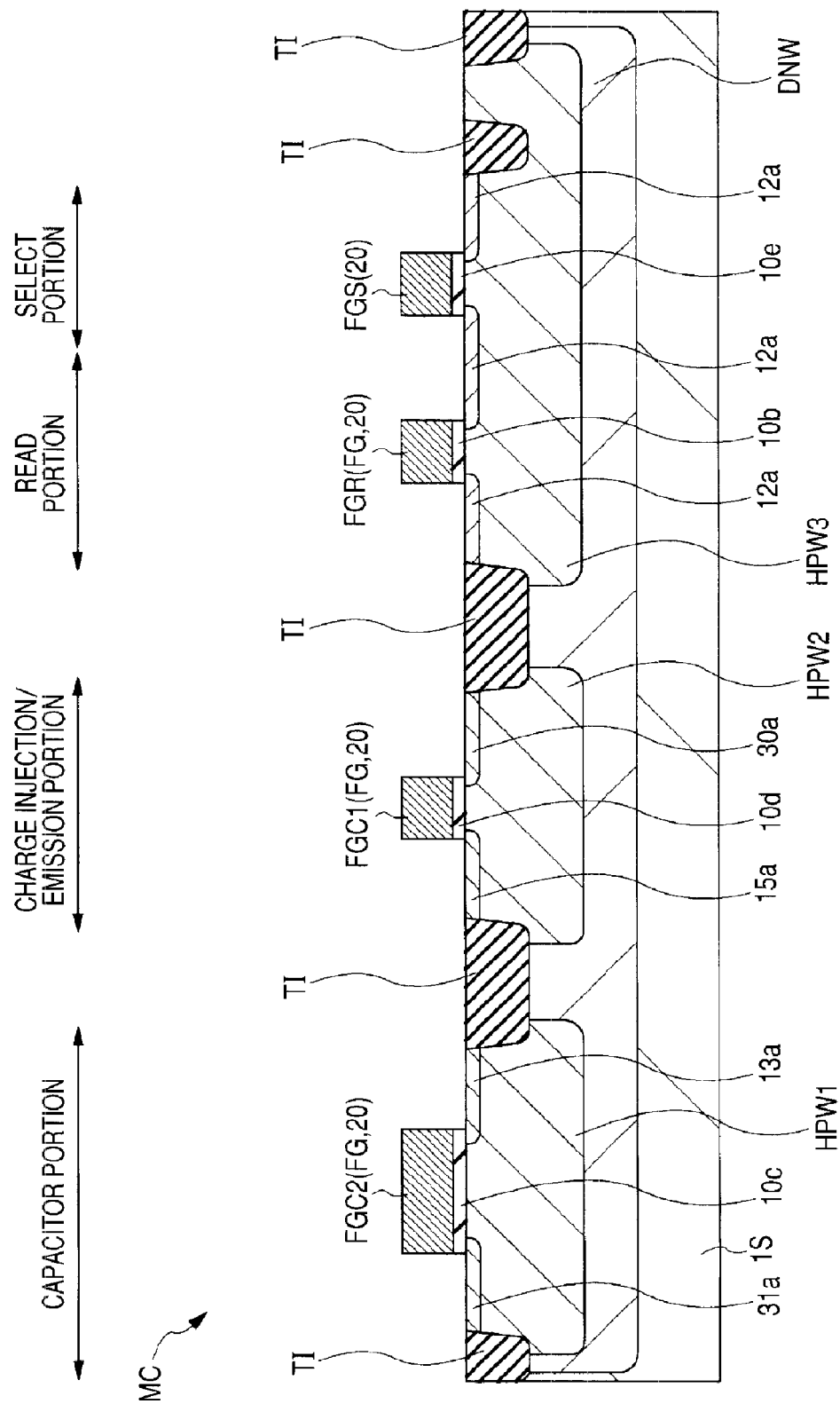
FIG. 15 is a cross-sectional view of the principal portion of the semiconductor substrate in the nonvolatile memory region in the same process step as shown in FIG. 14.

Then, as shown in FIGS. 14 and 15, the conductor film 20 is patterned by a lithographic step and an etching step to simultaneously form gate electrodes FGH, FGL, and FGS, and the floating electrode FG (the gate electrode FGR and the capacitor electrodes FGC1 and FGC2).

Subsequently, the p$^-$-type semiconductor regions 21$a$, 13$a$, and 15$a$ are simultaneously formed in the respective regions where the p-channel MIS transistor of the high breakdown voltage portion, the capacitor element C, and the data write/erase element CWE are to be formed by a lithographic step, an ion implantation method, and the like. Subsequently, an n$^-$-type semiconductor region 22$a$ and the n$^-$-type semiconductor regions 12$a$, 30$a$, and 31$a$ are simultaneously formed in the respective regions where the n-channel MIS transistor of the high breakdown voltage portion, the capacitor element C, and the data write/erase element CWE are to be formed, and in the respective regions where the data read element QR and the select MIS transistor QR are to be formed by a lithographic step, an ion implantation method, and the like.

Subsequently, a p$^-$-type semiconductor region 23$a$ is formed in the region where the p-channel MIS transistor of the low breakdown voltage portion is to be formed by a lithographic step, an ion implantation method, and the like. Then, an n$^-$-type semiconductor region 24$a$ is formed in the region where the n-channel MIS transistor of the low breakdown voltage portion is to be formed, by a lithographic step, an ion implantation method, and the like.

Figure 16:
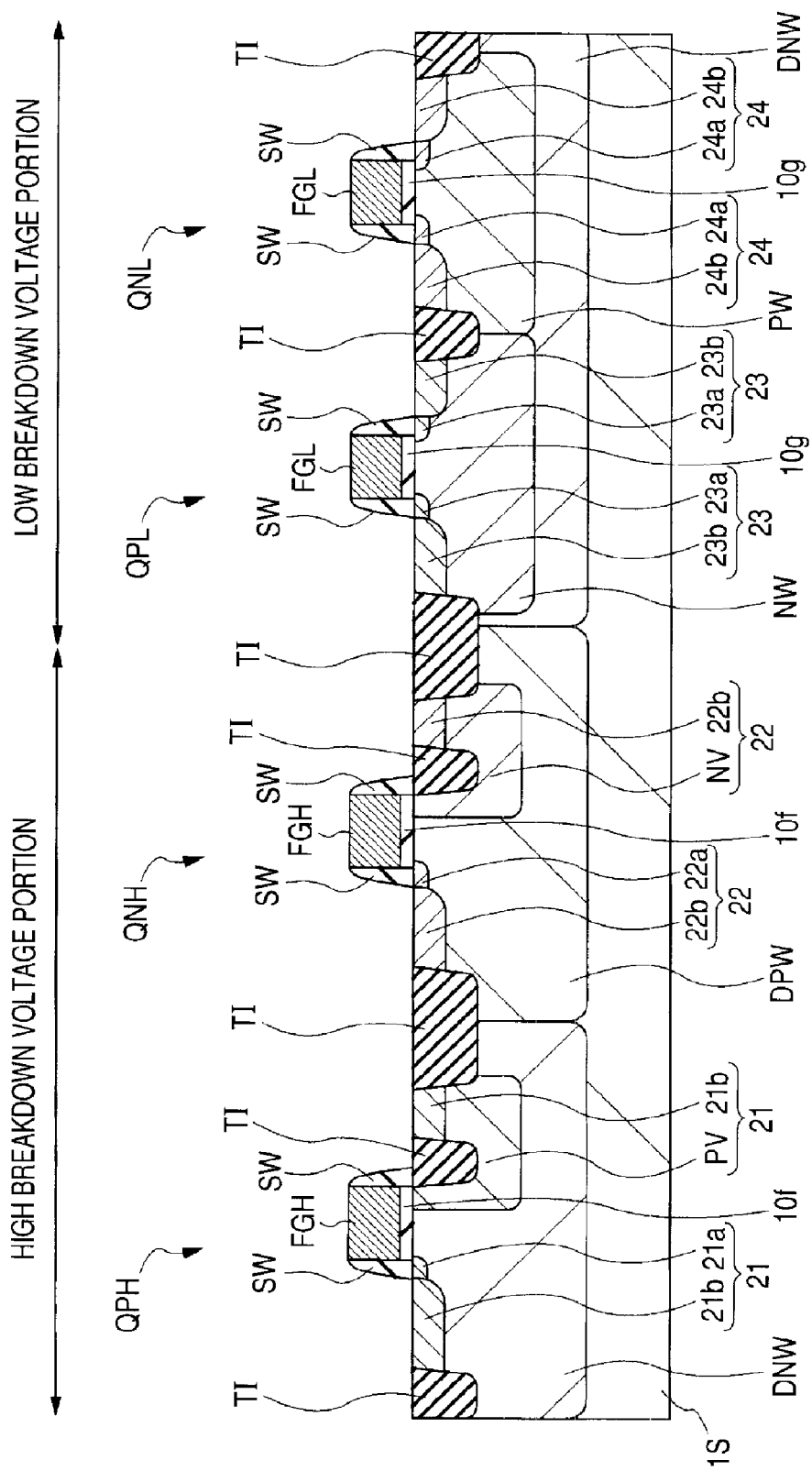
FIG. 16 is a cross-sectional view of the principal portion of the semiconductor substrate in the main circuit region in a process step of manufacturing the semiconductor device, which is subsequent to the process steps shown in FIGS. 14 and 15.
Figure 17:
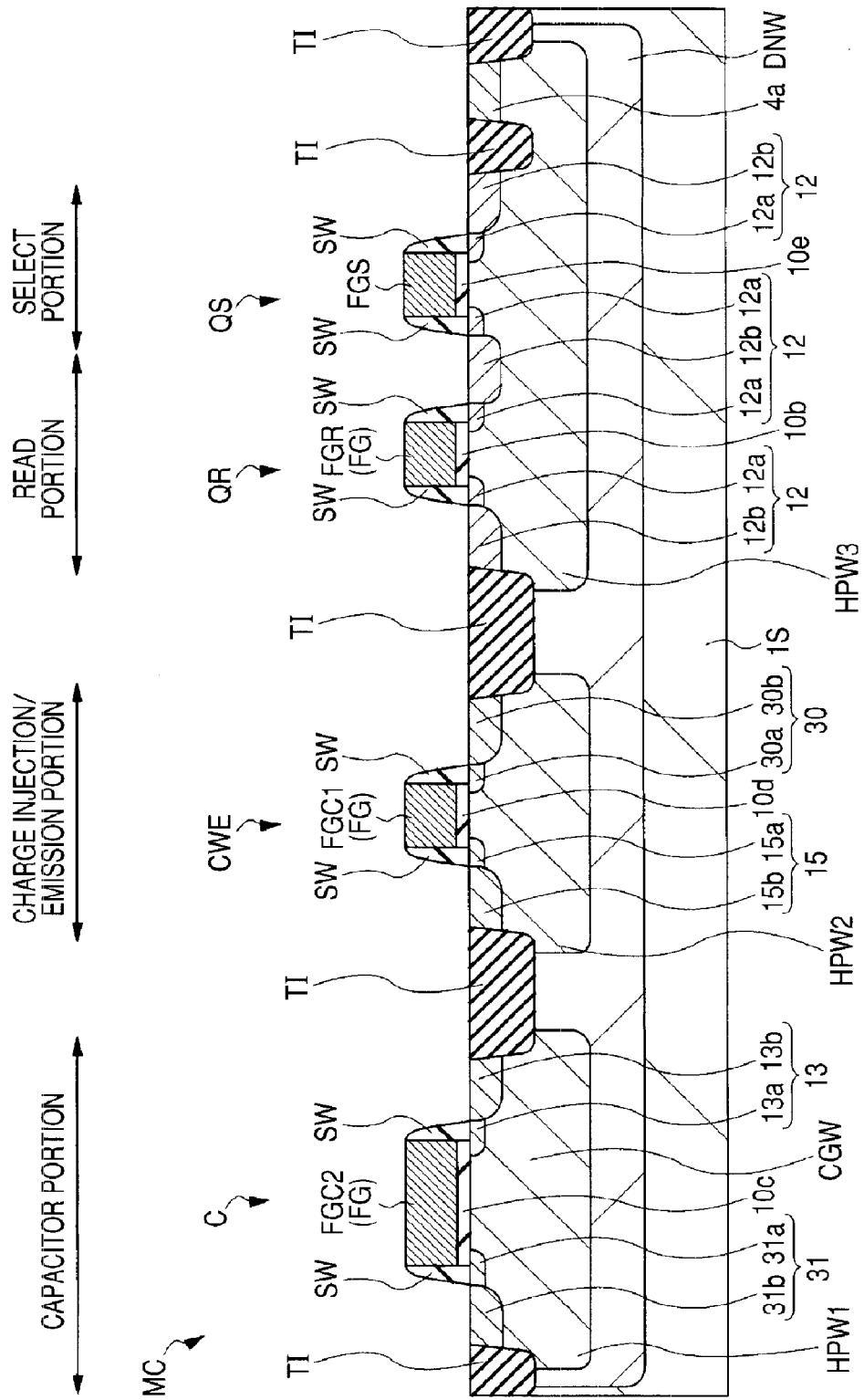
FIG. 17 is a cross-sectional view of the principal portion of the semiconductor substrate in the nonvolatile memory region in the same process step as shown in FIG. 16.

Then, as shown in FIGS. 16 and 17, an insulating film made of, e.g., silicon dioxide is deposited on the principal surface of the substrate 1S (semiconductor wafer) by a CVD method or the like. The deposited insulating film is then etched back by anisotropic dry etching to form the sidewalls SW on the respective side surfaces of the gate electrodes FGH, FGL, FGR, and FGS, and the capacitor electrodes FGC1 and FGC2.

Subsequently, p'-type semiconductor regions 21$b$ and 23$b$ and the p$^+$-type semiconductor regions 13$b$, 15$b$, and 4$a$ are simultaneously formed in the respective regions where the p-channel MIS transistors of the high breakdown voltage portion and the low breakdown voltage portion, the capacitor portion, and the charge injection/emission portion are to be formed, and in the extraction region of the p-type well HPW3 by a lithographic step, an ion implantation method, and the like. In this manner, source/drain p-type semiconductor regions 21 and a p-channel MIS transistor QPH are formed in the high breakdown voltage portion, while source/drain p-type semiconductor regions 23 and a p-channel MIS transistor QPL are formed in the low breakdown voltage portion. Additionally, in the region where the capacitor portion is to be formed, the p-type semiconductor region 13 is formed. In the region where the charge injection/emission portion is to be formed, the p-type semiconductor region 15 is formed.

Subsequently, n$^+$-type semiconductor regions 22$b$ and 24$b$ and the n'-type semiconductor regions 31$b$, 30$b$, and 12$b$ are simultaneously formed in the respective regions where the n-channel MIS transistors of the high breakdown voltage portion, the low breakdown voltage portion, the capacitor portion, the charge injection/emission portion, the read portion, and the select portion are to be formed by a lithographic step, an ion implantation method, and the like. In this manner, source/drain n-type semiconductor regions 22 and an n-channel MIS transistor QNH are formed in the high breakdown voltage portion, while source/drain n-type semiconductor regions 24 and an n-channel MIS transistor QNL are formed in the low breakdown voltage portion. In the region where the capacitor portion is to be formed, the n-type semiconductor region 31 is formed to form the capacitor element C. In the region where the charge injection/emission portion is to be formed, the n-type semiconductor region 30 is formed to form the data write/erase element CWE. Additionally, in the read portion and the select portion, the n-type semiconductor regions 12 are formed to form the data read element QR and the select MIS transistor QS.

Figure 18:
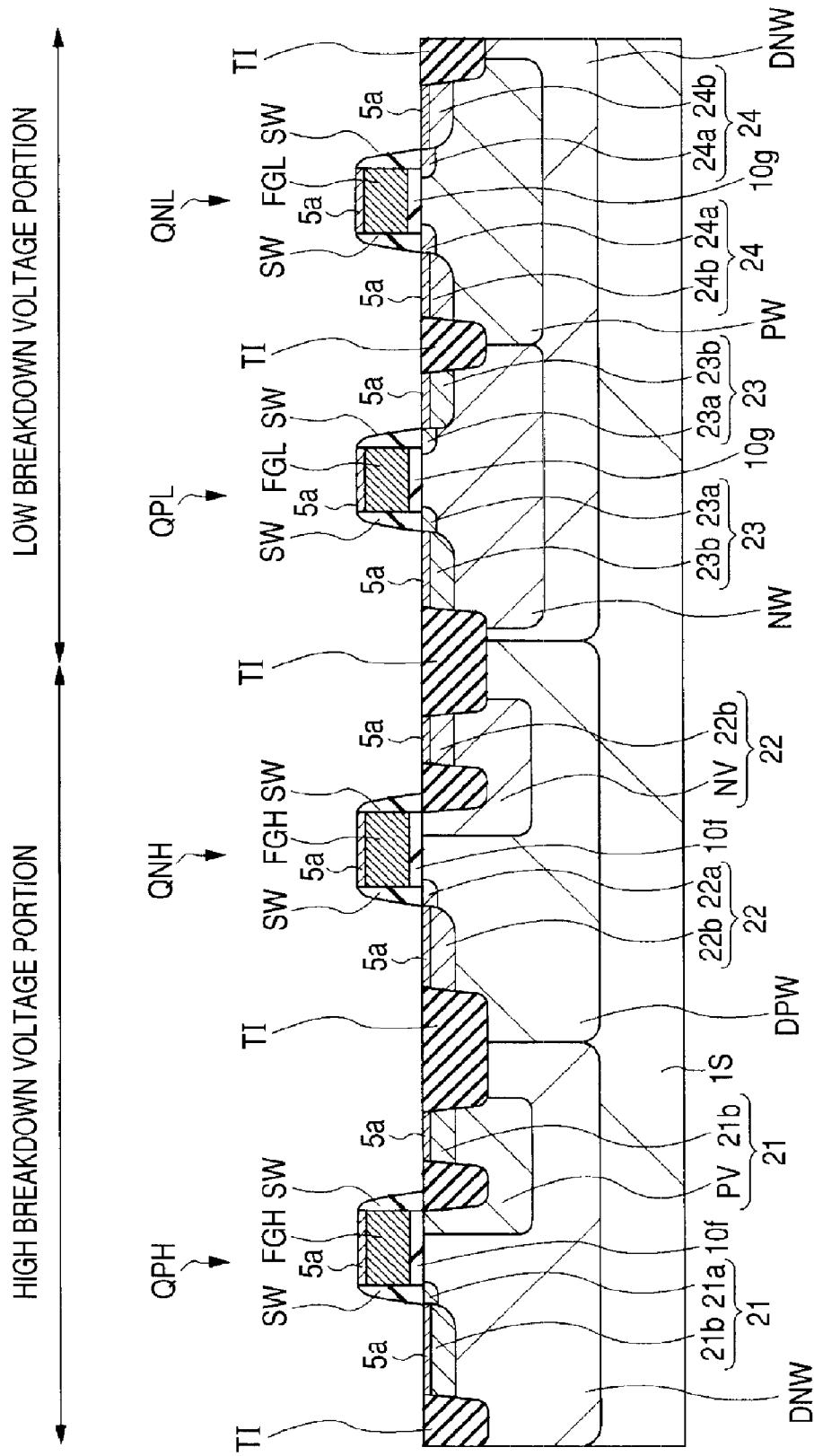
FIG. 18 is a cross-sectional view of the principal portion of the semiconductor substrate in the main circuit region in a process step of manufacturing the semiconductor device, which is subsequent to the process steps shown in FIGS. 16 and 17.
Figure 19:
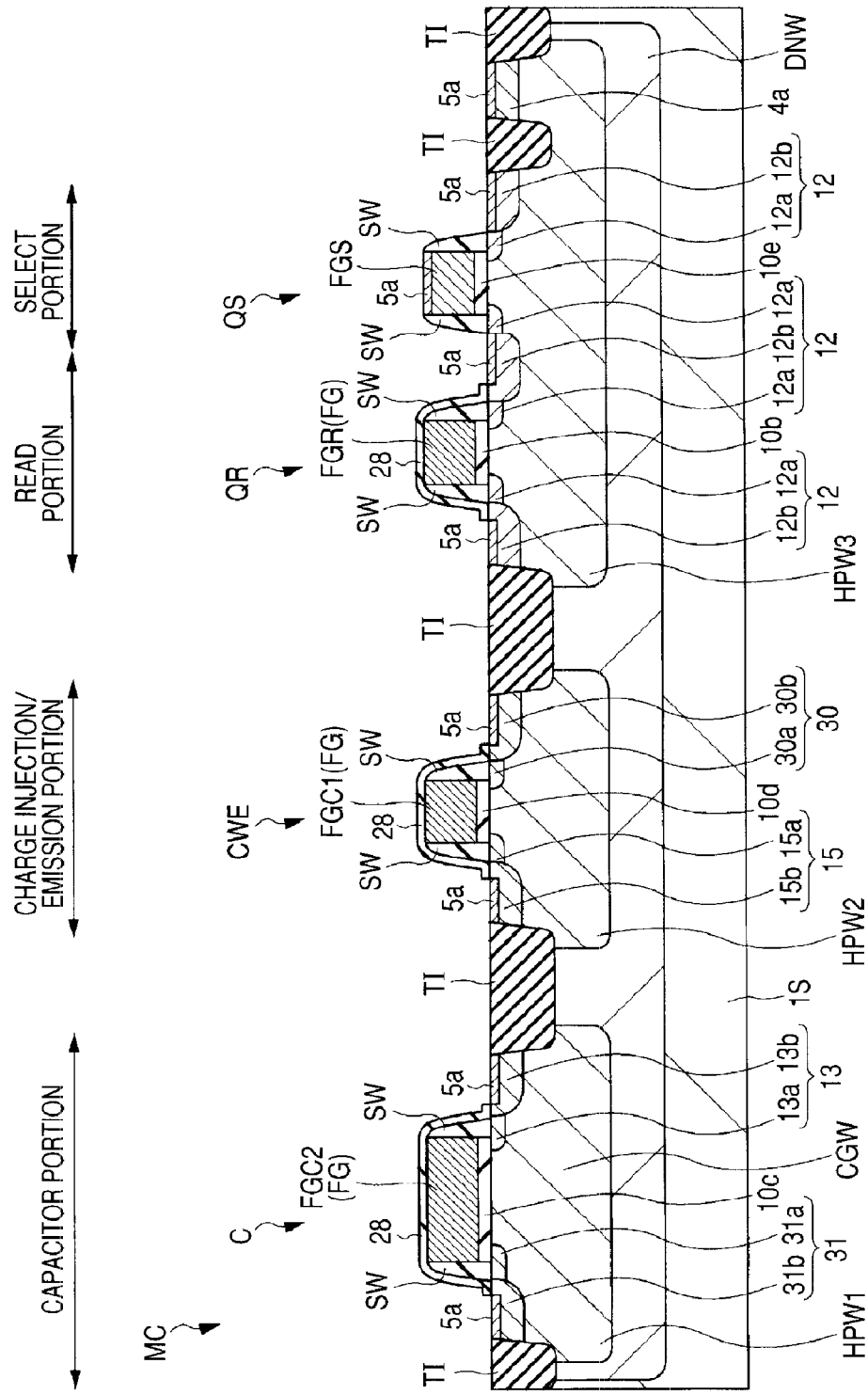
FIG. 19 is a cross-sectional view of the principal portion of the semiconductor substrate in the nonvolatile memory region in the same process step as shown in FIG. 18.

Then, as shown in FIGS. 18 and 19, the silicide layers 5$a$ are selectively formed. Prior to the step of forming the silicide layers 5$a$, insulating films 28 are formed on the respective upper surfaces of the floating electrodes FG (capacitor electrodes FG1 and FGC2, and gate electrode FGR) in the region with the memory cell MC to prevent the formation of the silicide layers 5$a$ in the portions. That is, the silicide layers 5$a$ are formed on the gate electrodes (FGH, FGL, and FGS) of the MIS transistors of the high breakdown voltage portion, the low breakdown voltage portion, and the select portion for the memory cell MC, while the silicide layers 5$a$ are not formed on the floating gate electrodes (FGC1, FGC2, and FGR) in the capacitor portion of the memory cell MC, the charge injection/emission portion thereof, and the read portion thereof. The insulating films 28 are each made of, e.g., a silicon dioxide film.

The reason for forming such insulating films 28 will be described hereinbelow. The floating electrodes FG of the memory element are each covered with a silicon nitride film (insulating films 6$a$ of FIG. 4) for forming a self-aligned contact. The film is generated by plasma CVD for a lower-temperature process. A silicon nitride film does not inherently have conductivity, but may occasionally have slight conductivity depending on a gas flow ratio or the startup state of a plasma during the generation of the film. In such a case, charges accumulated in the floating electrodes FG propagate along the silicon nitride film (insulating films 6$a$ of FIG. 4) to flow out into the substrate 1S. This may cause the problem that the memory cannot retain data. To solve the problem described above, the insulating films 28, e.g., silicon oxide films are sandwiched between the floating electrodes FG and the silicon nitride films (insulating films 6$a$ of FIG. 4) to prevent the migration of the charges from the floating electrodes FG to the silicon nitride films (insulating films 6$a$ of FIG. 4).

The insulating films 28 are formed to extend from the end portions of the sidewalls SW of each of the floating electrodes FG in the gate length direction. As a result, the silicide layers 5$a$ of the memory cell MC are formed by self alignment with respect to the insulating films 28.

The reason for thus forming the insulating films 28 will be described using the capacitor portion of the memory cell MC as an example. In the case of forming the silicide layers 5$a$ by self alignment with respect to the sidewalls SW without forming the insulating films 28, the end portions of the silicide layers 5$a$ become closer to the junction surface between the n$^-$-type semiconductor region 13$b$ and the substrate 1S.

In addition, because the n$^-$-type semiconductor region 13$a$ has an extremely shallow junction depth, the silicide layers 5$a$ may occasionally reach the substrate 1S beyond the n$^-$-type semiconductor region 13$a$. That is, in the case where the insulating films 28 are not formed, a leakage current is likely to flow from the end portion of the silicide layer 5$a$ formed on the upper surface of the n$^+$-type semiconductor region 13$b$ toward the substrate 1S under the n$^-$-type semiconductor region 13$a$. Therefore, in the memory cell according to the present embodiment, the insulating films 28 are formed to locate the silicide layers 5$a$ apart from the n'-type semiconductor region 13$b$ so that a leakage current is less likely to flow.

The insulating films 28 are used also for a resistor element formed in another region of the substrate 1S or the like, though not shown. The insulating films 28 allow selective formation of the silicide layers 5$a$ on the semiconductor substrate and the polysilicon films. As a result, it is possible for the resistor element to obtain a desired resistance value.

Thus, the insulating films 28 simultaneously achieve the effects described above in the memory cell MC.

Figure 20:
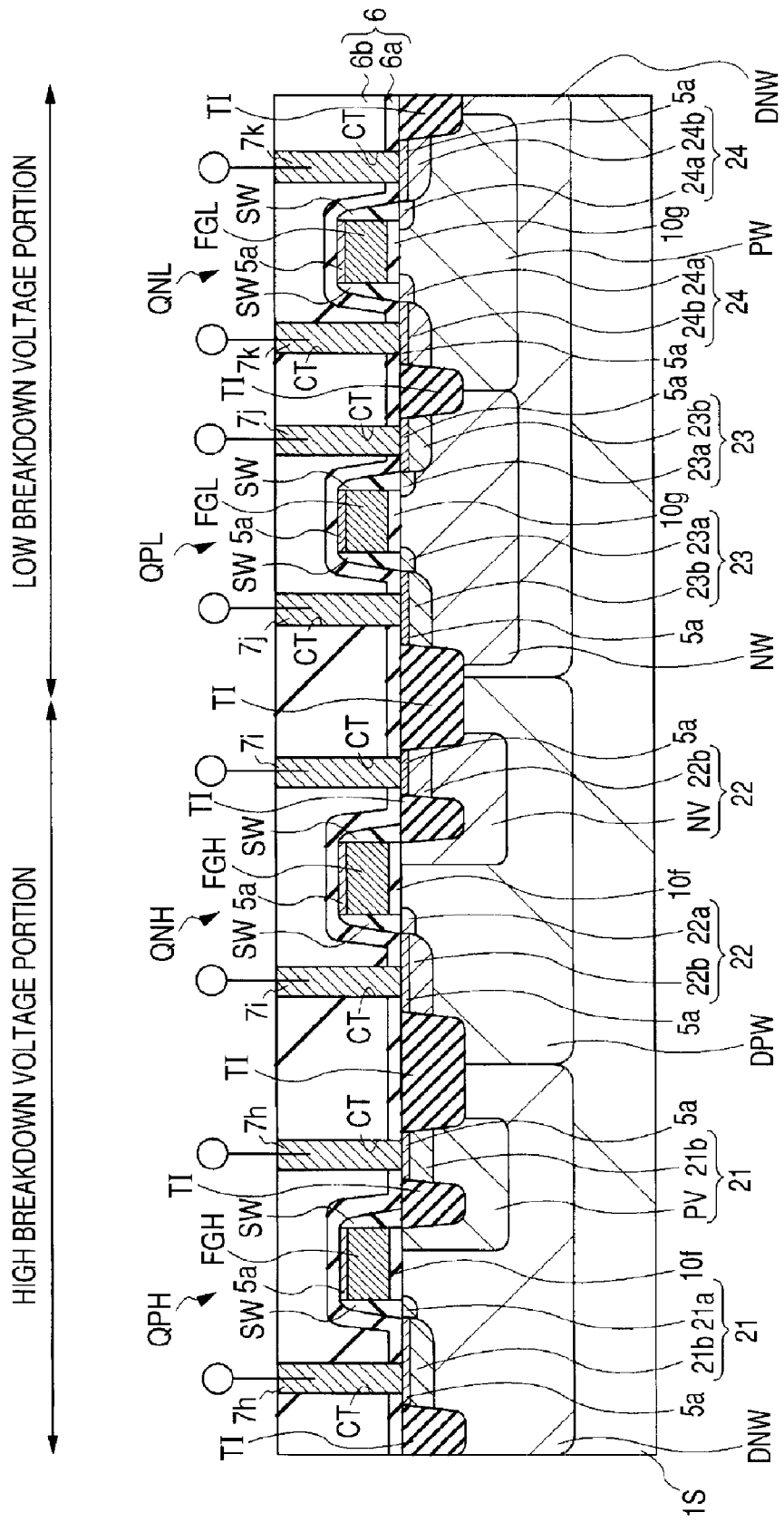
FIG. 20 is a cross-sectional view of the principal portion of the semiconductor substrate in the main circuit region in a process step of manufacturing the semiconductor device, which is subsequent to the process steps shown in FIGS. 18 and 19.
Figure 21:
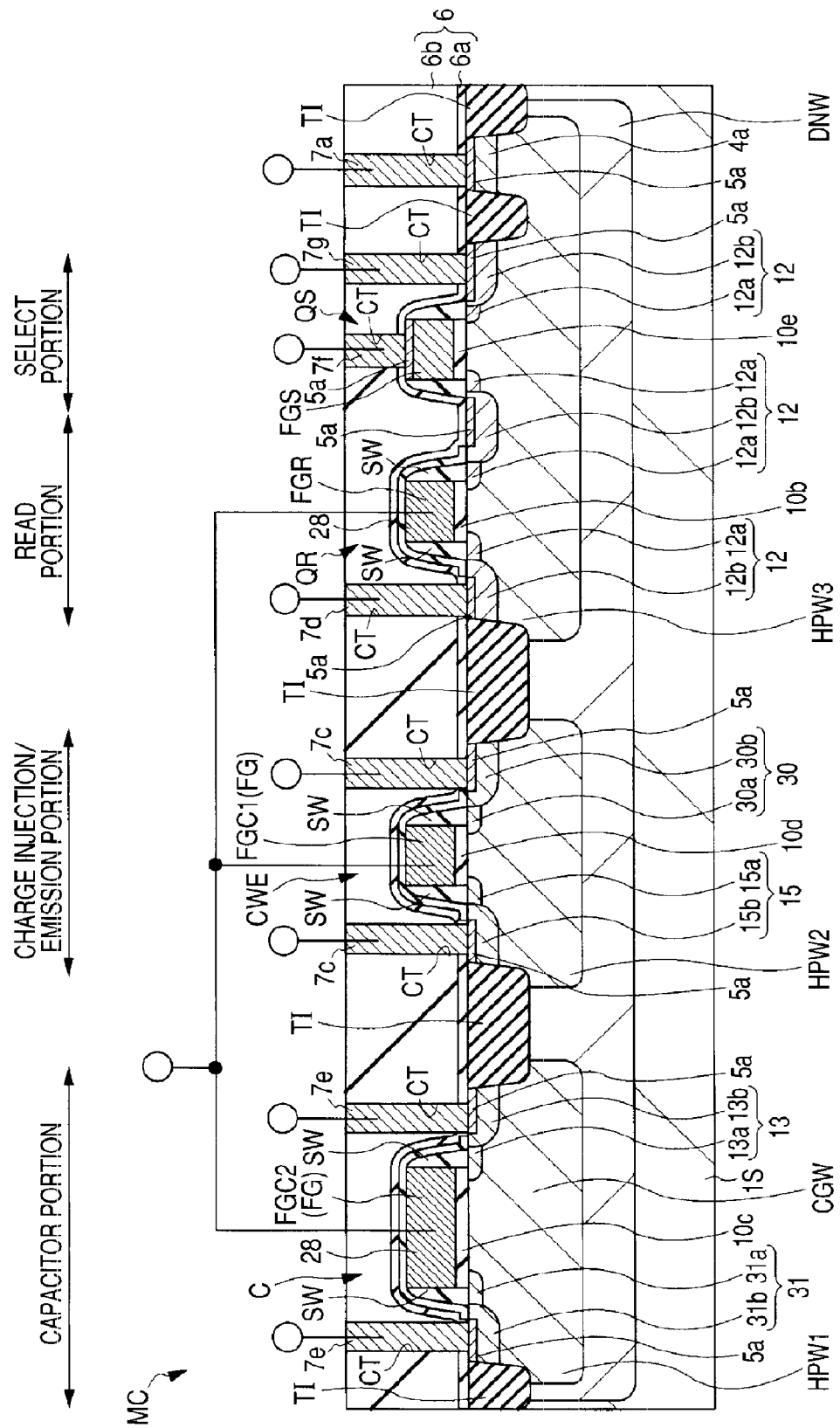
FIG. 21 is a cross-sectional view of the principal portion of the semiconductor substrate in the nonvolatile memory region in the same process step as shown in FIG. 20.

Subsequently, as shown in FIGS. 20 and 21, the insulating layer 6$a$ made of, e.g., silicon nitride is deposited on the principal surface of the substrate 1S (semiconductor wafer) by a CVD method or the like. Then, insulating layer 6$b$ made of, e.g., silicon dioxide is deposited thereon to be thicker than the insulating layer 6$a$ by a CVD method or the like. Further, a CMP (chemical mechanical polishing) process is performed with respect to the insulating layer 6$b$ to planarize the upper surfaces of the insulating layer 6$b$. Thereafter, the contact holes CT are formed in the insulating layer 6 by a lithographic step and an etching step. Then, a conductor film made of, e.g., tungsten (W) is deposited on the principal surface of the substrate 1S (semiconductor wafer) by a CVD method or the like, and then polished by a CMP method or the like to form the conductor portions 7$a$, and 7$c$ to 7$k$. in the contact holes CT. Afterward, the semiconductor device is manufactured through a typical wire forming step, an inspection step, and an assembly step.

According to the present first embodiments, it is possible to simultaneously form the portions forming the MIS transistors QPH, QNH, QPL, and QNL for the LCD driver circuit, and the portions forming the capacitor element C of the memory cell MC, the write/erase element CWE thereof, the read element QR thereof, and the select MIS transistor QS. As a result, the steps of manufacturing the semiconductor device can be simplified. This allows a reduction in the manufacturing time of the semiconductor device, and also allows a cost reduction for the semiconductor device.

In addition, it is possible to convert the single external power source voltage (e.g., 3.3 V) of the semiconductor device to a voltage (e.g., −9 V) used during data writing to the memory cell MC with a negative voltage boosting circuit (internal voltage boosting circuit) for the LCD driver circuit. It is also possible to convert the single external power source voltage (e.g., 3.3 V) to a voltage (e.g., 9 V) used during data erasing from the memory cell MC with a positive voltage boosting circuit (internal voltage boosting circuit) for the LCD driver circuit. That is, it is unnecessary to newly provide an internal voltage boosting circuit for the nonvolatile memory. As a result, it is possible to reduce the internal circuit of the semiconductor device to a small scale, and thereby promote the miniaturization of the semiconductor device.

(Embodiment 2)

Figure 22:
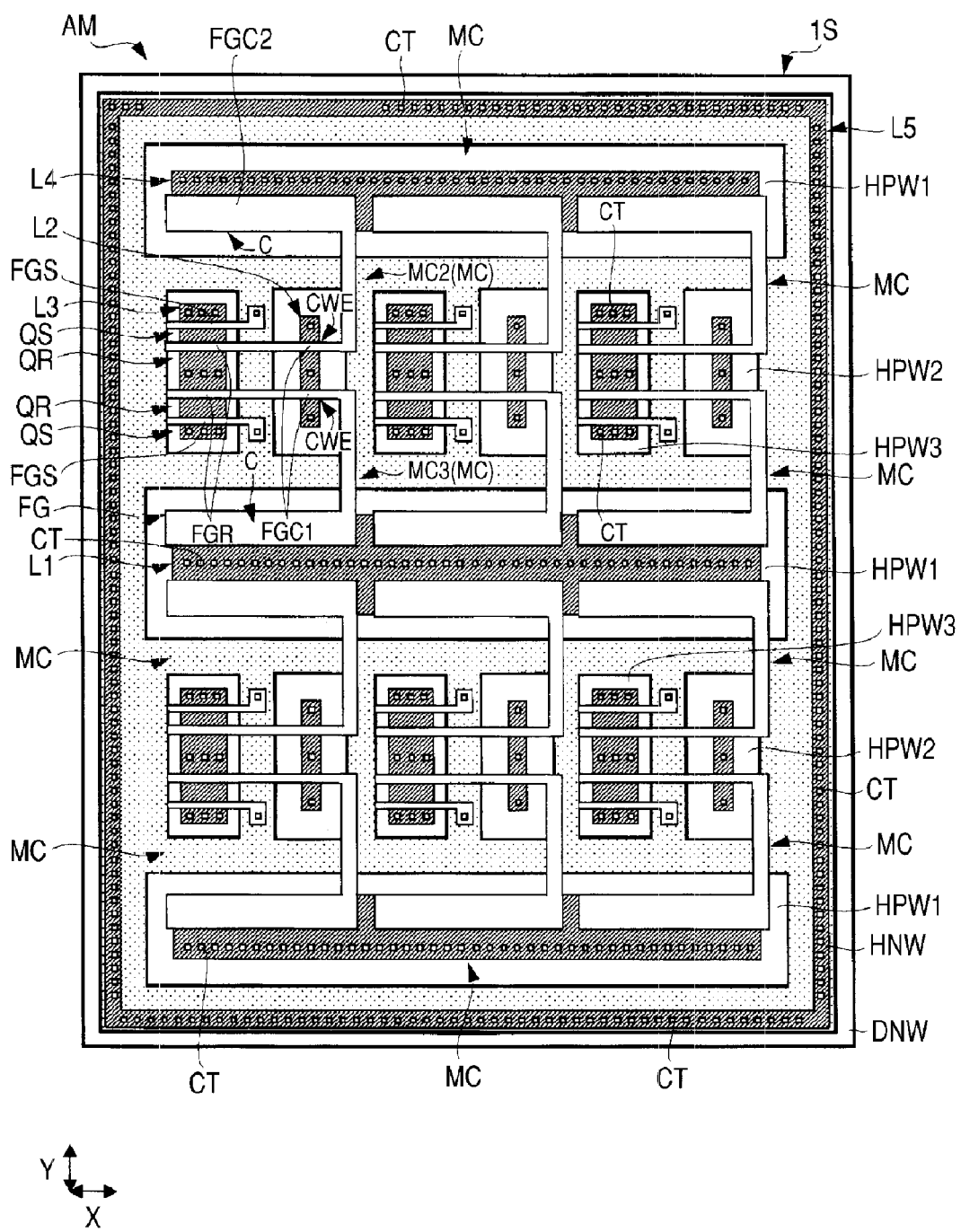
FIG. 22 is a plan view of a nonvolatile memory arranged in a nonvolatile memory region in a second embodiment of the present invention.

In a semiconductor device according to the second embodiment of the present invention, a main circuit and a nonvolatile memory for storing desired data (information) of a relatively small capacity related to the main circuit are formed respectively in a main circuit region and a nonvolatile memory region which are arranged in the same semiconductor chip (semiconductor substrate), in the same manner as in the first embodiment described above. FIG. 22 is a plan view of a nonvolatile memory arranged in the nonvolatile memory region AM of a substrate 1S according to the present second embodiment, which shows the case where the nonvolatile memory has a 12-bit configuration. The nonvolatile memory (see FIG. 22) according to the present second embodiment is different from the nonvolatile memory (see FIGS. 1 to 3) shown in the first embodiment in plan layout.

As shown in FIG. 22, the nonvolatile memory according to the present second embodiment comprises a plurality of memory cells MC (which are twelve in FIG. 22) each comprising a data write/erase element CWE, a data read element QR, and a capacitor element C which are formed in the principal surface of the substrate 1S. These memory cells MC are arranged at the positions where bit lines (arranged along a first direction Y in the drawings), and word lines (arranged along a second direction X in the drawings) which are arranged in a matrix to intersect each other.

The plurality of memory cells MC formed in the principal surface of the substrate 1S include a memory cell MC1 and a memory cell M2 which are arranged adjacent to each other. In the principal surface of the substrate 1S, active regions L1 to L5 electrically isolated from each other are arranged.

In the active regions L1 to L4, the capacitor element C of the memory cell MC1 is formed in the active region L1, the respective write/erase elements CWE of the memory cells MC1 and MC2 are both formed in the active region L2, the respective read elements QR of the memory cells MC1 and MC2 are both formed in the active region L3, and the capacitor element C of the memory cell MC2 is formed in the active region L4.

Thus, in the semiconductor device according to the second embodiment also, the respective write/erase elements CWE of the memory cells MC1 and MC2 are formed in the common active region L2, and the respective read elements QR of the memory cells MC1 and MC2 are formed in the common active region L3. This allows a reduction in chip area.

In the plan layout shown in the present second embodiment, the capacitor element C (capacitor electrode FGC2) not forming the memory cell MC shown in FIGS. 1 to 3 according to the first embodiment need not be arranged. As a result, it is possible to ensure a large plan area for the capacitor electrode FGC2, and accordingly increase a coupling ratio. This allows an improvement in the efficiency of voltage supply from the word line (control gate line).

As for the structures of the MIS transistors of the high breakdown voltage portion and the low breakdown voltage portion, they are the same as in the first embodiment described above.

The cross-sectional structures of the respective floating electrodes of the capacitor portion of the memory cell MC, the charge injection/emission portion thereof, the read portion thereof, and the select portion are also the same as in the first embodiment described above.

(Embodiment 3)

In the first embodiment described above, when a write operation is performed to the selected memory cell MCs, the well HPW1 of the capacitor element C is set to 9 V by applying the control voltage of 9 V to the control gate line CG (word line), and the well HPW2 of the write/erase element CWE is set to −9 V by applying the negative voltage of −9 V to the write/erase bit line WBL (data line), so that the FN tunnel current is generated to perform the write operation.

Figure 23:
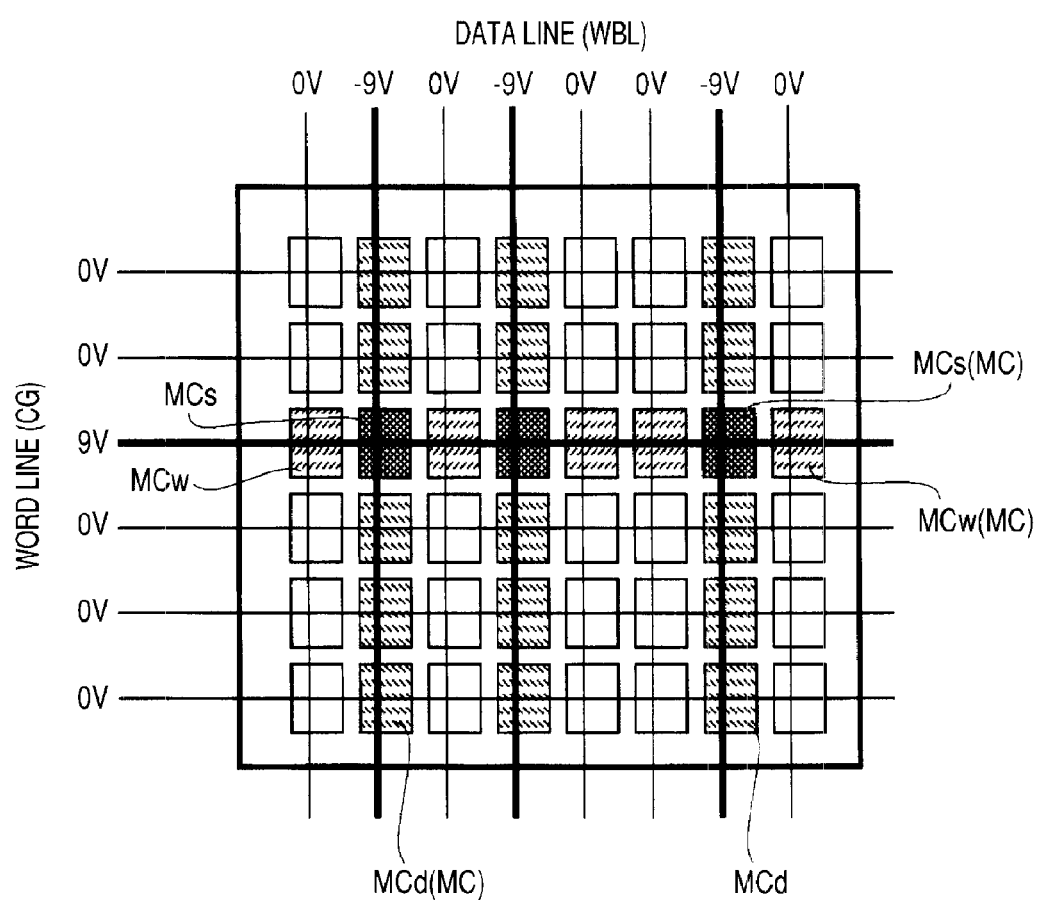
FIG. 23 is an illustrative view of a write operation in a memory array in a third embodiment of the present invention.
Figure 24:
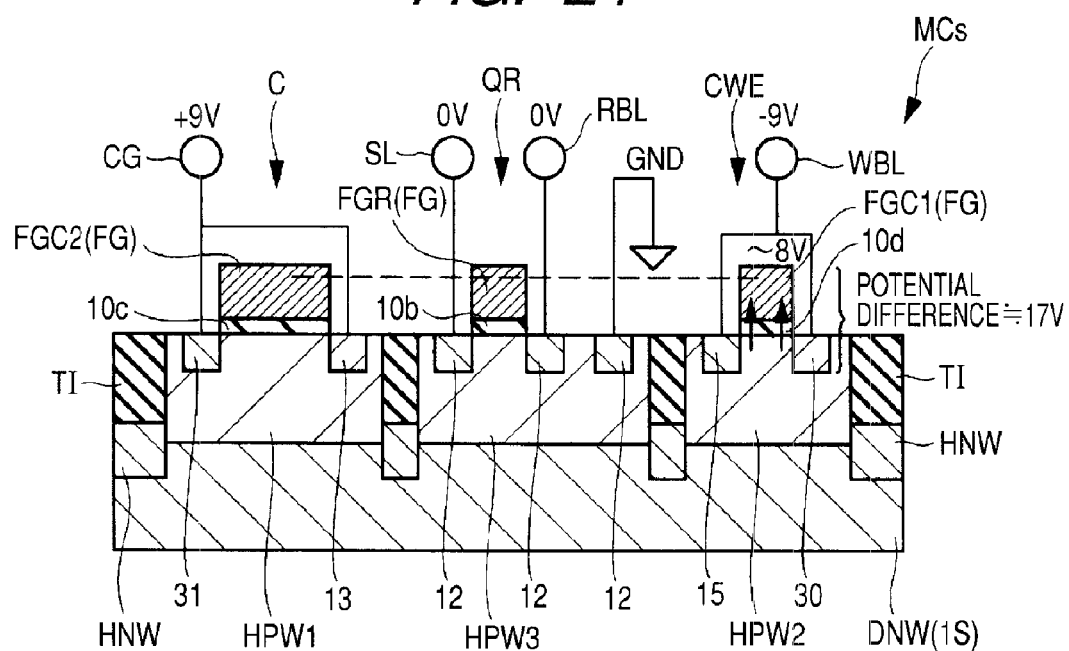
FIG. 24 is a cross-sectional view schematically showing a cross section of each of the selected memory cells of FIG. 23.
Figure 25:
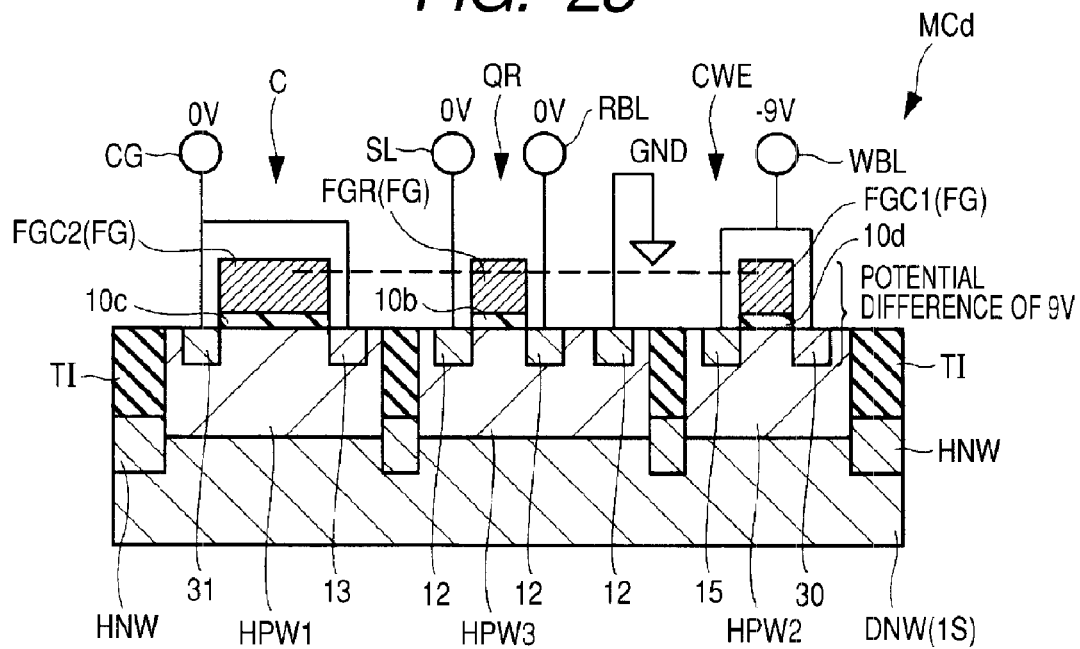
FIG. 25 is a cross-sectional view schematically showing a cross section of the memory cell of FIG. 23 in which a data disturb condition occurs.
Figure 26:
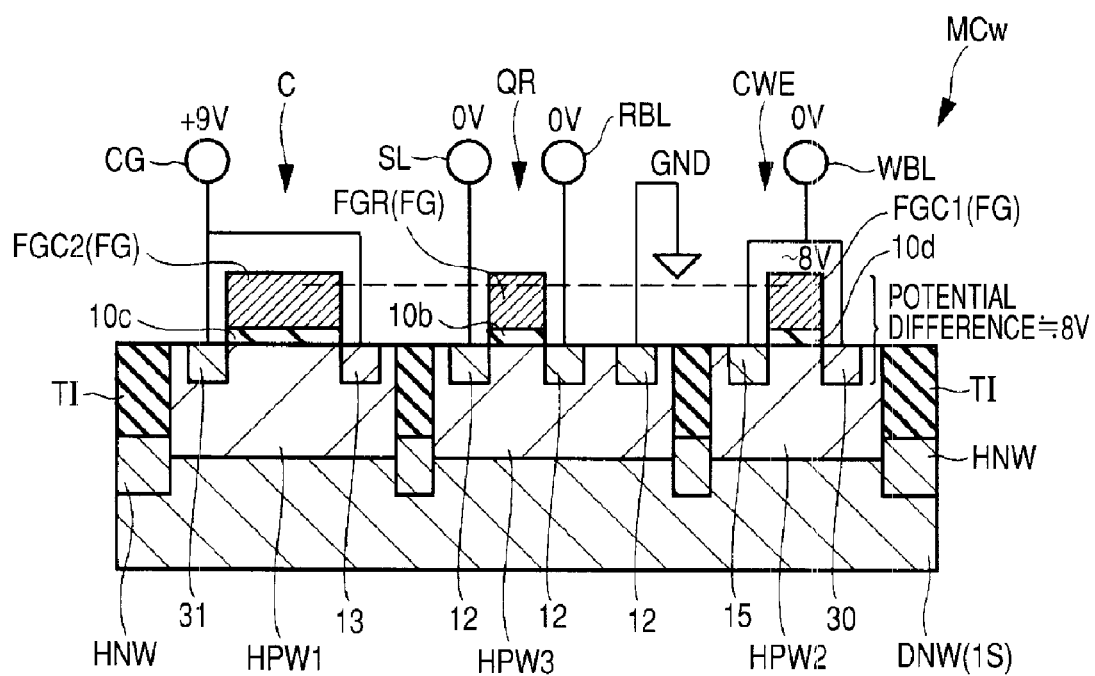
FIG. 26 is a cross-sectional view schematically showing a cross section of the memory cell of FIG. 23 in which a word disturb condition occurs.
Figure 27:
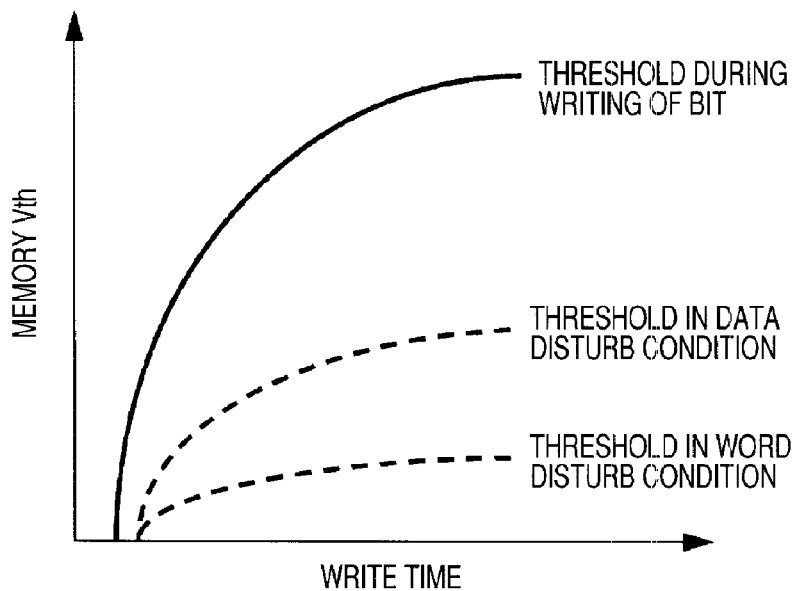
FIG. 27 is an illustrative view showing the characteristics of the threshold of the memory cell with respect to a write time when the voltages shown in FIG. 23 are applied to the individual components.

FIG. 23 is a layout diagram of a memory array in which a plurality of memory cells MC which are arranged at the positions where word lines (control gate lines CG) and data lines (bit lines WBL) intersect each other are arranged as blocks in a matrix, which shows an example of voltages applied to individual components, and the respective conditions of the individual memory cells when a write operation is performed. The conditions of the individual memory cells MC include a selected condition (memory cells MCs), a word disturb condition (memory cell MCw), a data disturb condition (memory cell MCd), and a non-selected condition other than those mentioned above. FIGS. 24 to 26 are cross-sectional views schematically showing the cross sections of the memory cells MC when the voltages are applied to the individual components shown in FIG. 23, which respectively shows the selected condition, the data disturb condition, and the word disturb condition. Each of the memory cells of FIGS. 24 to 26 is the memory cell MC of FIG. 4 shown above in the first embodiment, which is shown herein in a schematic manner. FIG. 27 is an illustrative view showing the characteristics of the thresholds of the memory cells MC with respect to a write time when the voltages are applied to the individual components shown in FIG. 23.

As shown in FIG. 27, in terms of the single individual memory cell, writing to each of the selected memory cells MCs causes a normal operation at a predetermined threshold. However, in terms of the memory array, the injection of electrons into the non-selected memory cell MC (to which writing should not be performed) may occasionally cause the disturb condition in which the threshold of the memory cell MC rises. The disturb condition is sub-divided into the data disturb condition in which the potential from the bit line WBL (data line) affects the threshold, and the word disturb condition in which the potential from the control gate line CG (word line) affects the threshold.

As shown in FIG. 23, to perform a write operation to each of the selected memory cells MCs, a control voltage of 9 V is applied to the word line (control gate line CG), and a negative voltage of −9 V is applied to each of the data lines (bit lines WBL). In the memory cell MCs in the selected condition (see FIG. 24), the control voltage of 9 V is applied from the control gate line CG to the well HPW1 of the capacitor element C, while a negative voltage of −9 V is applied from the corresponding bit line WBL to the well HPW2 of the write/erase element CWE, so that a FN tunnel current is generated in the capacitor insulating film 10d with the potential difference of 17 V therebetween to perform writing. The potential of the capacitor electrode FGC1 (floating electrode FG) of the write/erase element CWE becomes about 8 V as a result of a voltage drop.

In this manner, the electrons in the well HPW2 of the write/erase element CWE are injected into the capacitor electrode FGC1 (floating electrode FG) through the capacitor insulating film 10d with the FN tunnel current of the entire surface of the channel, so that data is written.

However, each of the bit lines WBL (data lines) for applying the voltage of −9 V to the well HPW2 of the write/erase element CWE of the corresponding memory cell MCs is coupled to the memory cells MCd other than the memory cell MCs as shown in FIG. 23, so that the data disturb condition occurs in each of the memory cells MCd. Specifically, in the memory cell MCd (see FIG. 25) in the data disturb condition, a control voltage of 0 V is applied from the corresponding control gate line CG to the well HPW1 of the capacitor element C, while a negative voltage of −9 V is applied from the corresponding bit line WBL to the well HPW2 of the write/erase element CWE, so that the potential difference of about 9 V therebetween is applied to the capacitor insulating film 10d to raise the threshold (see FIG. 27).

On the other hand, the control gate line CG (word line) for applying a voltage of 9 V to the well HPW1 of the capacitor element C of each of the memory cells MCs is coupled to the memory cells MCw other than the memory cells MCs as shown in FIG. 23, so that the word disturb condition occurs in each of the memory cells MCw. Specifically, in the memory cell MCw (see FIG. 26) in the word disturb condition, a control voltage of 9 V is applied from the corresponding control gate line CG to the well HPW1 of the capacitor element C, while a voltage of 0 V is applied from the corresponding bit line WBL to the well HPW2 of the write/erase element CWE, so that the potential difference of about 8 V therebetween is applied to the capacitor insulating film 10d to raise the threshold (see FIG. 27). The potential of the capacitor electrode FGC1 (floating electrode FG) of the write/erase element CWE becomes about 8 V as a result of a voltage drop.

Thus, the writing to the selected memory cells MCs causes the disturb condition in each of the memory cells MC to which writing should not be performed. Since each of the memory cells MC utilizes a FN tunnel current, even with 9 V applied only to one of the wells when the memory cell MC is half-selected, a threshold variation is likely to occur. Unless the disturb condition decreases, erroneous writing occurs.

In particular, as shown in FIG. 27, the threshold of the memory cell in the data disturb condition rises compared with that of the memory cell in the word disturb condition. This may be conceivably because, in the case of writing performed by applying the control voltage of 9 V to the control gate line CG, and applying the negative voltage of −9 V to each of the write/erase bit lines WBL, the potential difference applied to the capacitor insulating film 10d is about 8 V in the word disturb condition, while the potential difference applied thereto is about 9 V in the data disturb condition.

Figure 28:
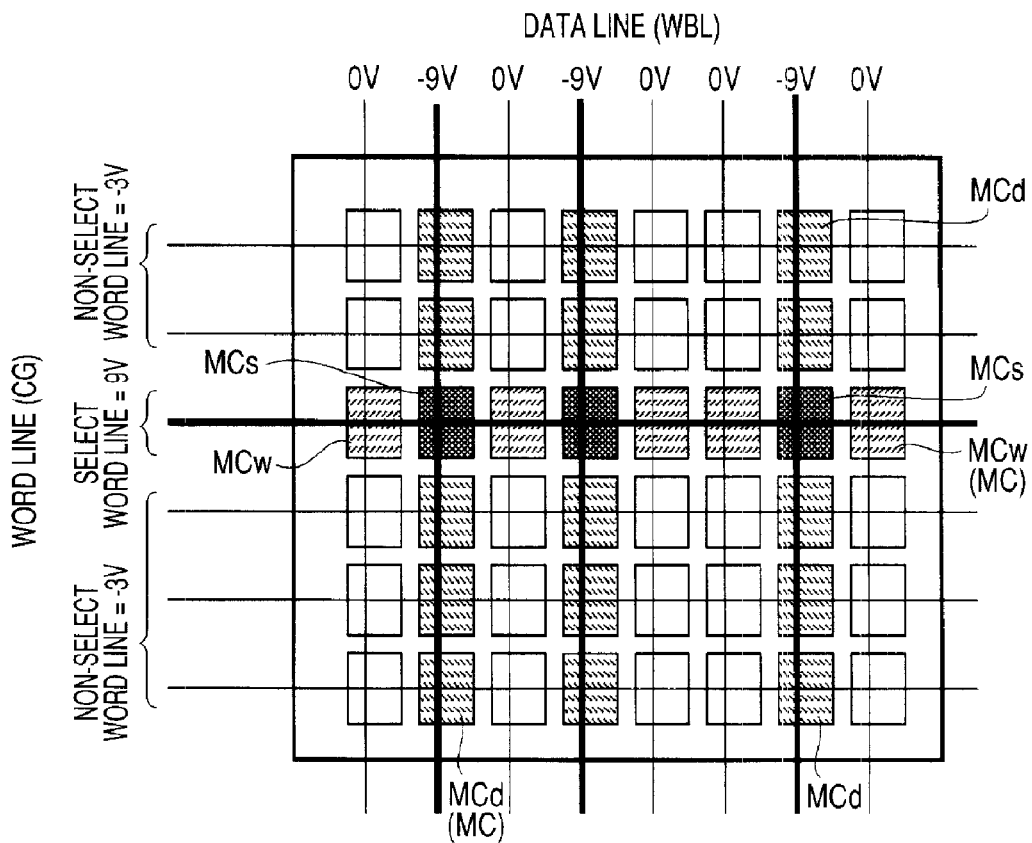
FIG. 28 is an illustrative view of another example of the write operation in the memory array of FIG. 23.
Figure 29:
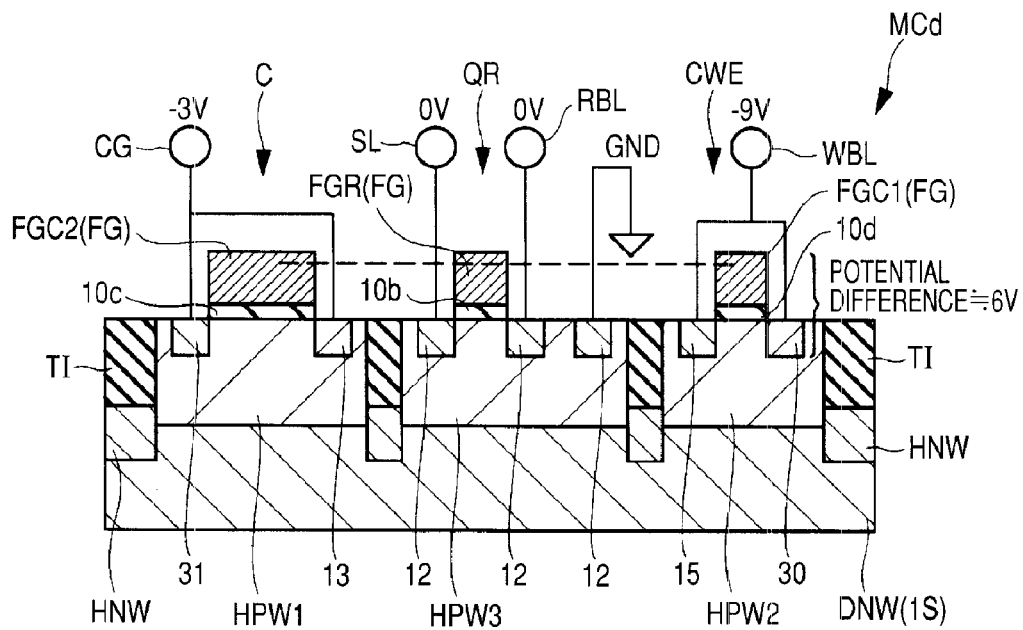
FIG. 29 is a cross-sectional view schematically showing a cross section of the memory cell of FIG. 28 in which the data disturb condition occurs.
Figure 30:
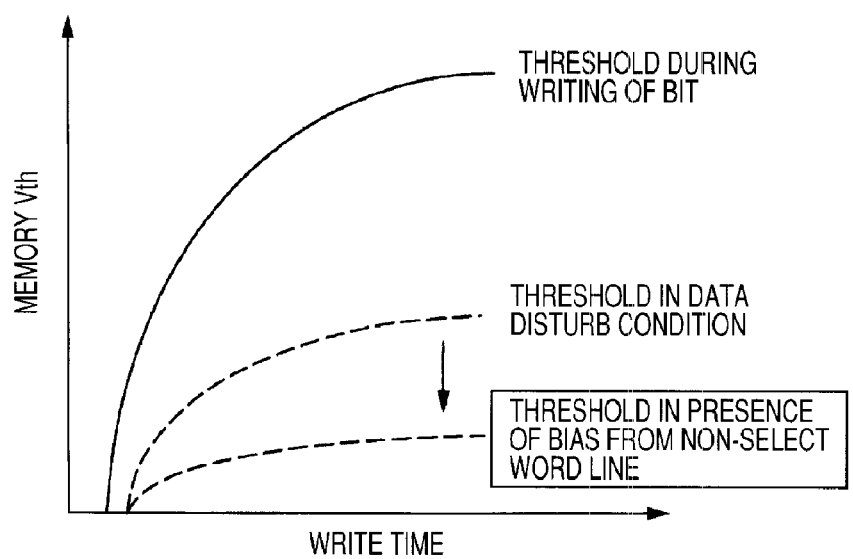
FIG. 30 is an illustrative view showing the characteristics of the threshold of the memory cell with respect to the write time when the voltages shown in FIG. 28 are applied to the individual components.

In view of the foregoing, a description will be given to a technology which can reduce the disturb condition in the memory array by adjusting the voltages applied to the individual components during data writing. FIG. 28 is a layout diagram of a memory array in which the plurality of memory cells MC arranged at the positions where the word lines (control gate lines CG) and the data lines (write bit lines WBL) intersect each other are arranged as blocks in a matrix. FIG. 28 shows the case where voltages different from those applied to the individual components shown in FIG. 23 are applied thereto. FIG. 29 is a cross-sectional view of the memory cell MC in the data disturb condition when the voltages are applied to the individual components shown in FIG. 28. The memory cell of FIG. 29 is the memory cell of FIG. 4, which is shown herein in a schematic manner. FIG. 30 is an illustrative view showing the characteristics of the thresholds of the memory cells MC with respect to the write time when the voltages shown in FIG. 28 are applied to the individual components shown in FIG. 28.

As shown in FIG. 28, to perform a write operation to each of the selected memory cells MCs, a positive voltage of 9 V is applied to the word line (select word line), and a negative voltage of −9 V is applied to the corresponding data line (select data line). As a result, a tunnel current is generated in each of the selected memory cells MCs to perform the writing of data, as described above. In addition, a voltage (counter voltage) of −3 V is applied to each of the non-select word lines.

Consequently, as shown in FIG. 29, a voltage of −3 V is applied from the corresponding control gate line CG to the well HPW1 of the capacitor element C of each of the memory cells MCd, while a negative voltage of −9 V is applied from the corresponding bit line WBL to the well HPW2 of the write/erase element CWE, so that the potential difference of about 6 V therebetween is applied to the capacitor insulating film 10d. The potential difference (about 6 V) is lower than the potential difference (about 9 V) resulting from the application of the voltages shown in FIG. 25.

Thus, the potential difference applied to the capacitor insulating film 10 lowers to accordingly allow a reduction in data disturb condition, and allow a reduction in threshold variation, as shown in FIG. 30. In addition, because the influence of the disturb condition on writing need not be considered, a complicated control circuit is no more necessary, which is effective in improving the reliability of the semiconductor device and reducing the area of the semiconductor chip.

To reduce the word disturb condition, it is also possible to further apply a positive voltage of 3 V to each of the data lines (non-select data lines) other than the data line (select data line) for selecting each of the memory cells MCs. That is, in the application of the voltages to the individual components shown in FIG. 26, a positive voltage of 3 V, instead of 0 V, is applied to each of the bit lines WBL (non-select data lines). Consequently, a control voltage of 9 V is applied from the control gate line CG to the well HPW1 of the capacitor element C, while a voltage of 3 V is applied from the corresponding bit line WBL to the well HPW2 of the write/erase element CWE, so that the potential difference of about 5 V therebetween is applied to the capacitor insulating film 10d. The potential difference (about 5 V) is lower than the potential difference (about 8 V) resulting from the application of the voltages shown in FIG. 26.

Thus, the potential difference applied to the capacitor insulating film 10d lowers to accordingly allow a reduction in word disturb condition, and allow a reduction in threshold variation.

When an erase operation is performed to each of the selected memory cells MCs in the first embodiment described above, the well HPW1 of the capacitor element C is set to −9 V by applying the negative voltage of −9 V to the control gate line CG (word line), and the well HPW2 of the write/erase element CWE is set to 9 V by applying the positive voltage of 9 V to the write/erase bit line WBL (data line), so that the FN current is generated to perform erasing.

Figure 31:
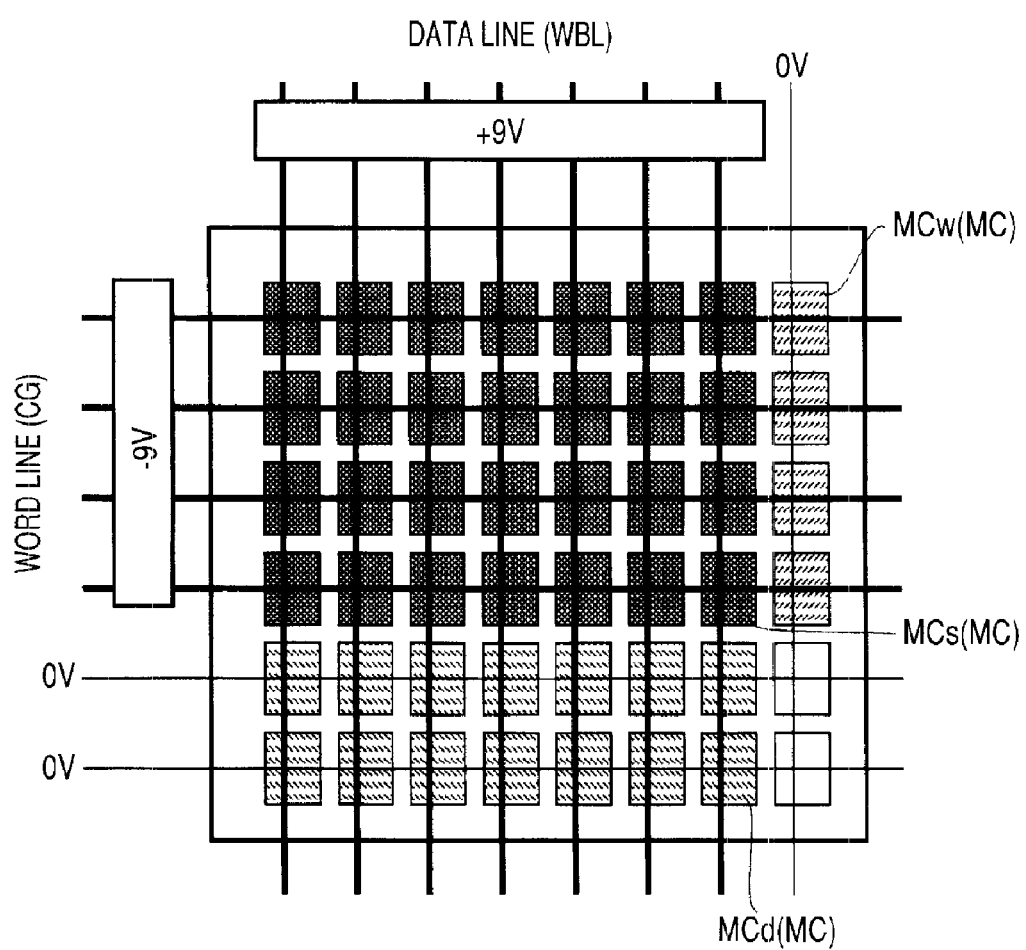
FIG. 31 is an illustrative view of an example of an erase operation to the memory array in the third embodiment.
Figure 32:
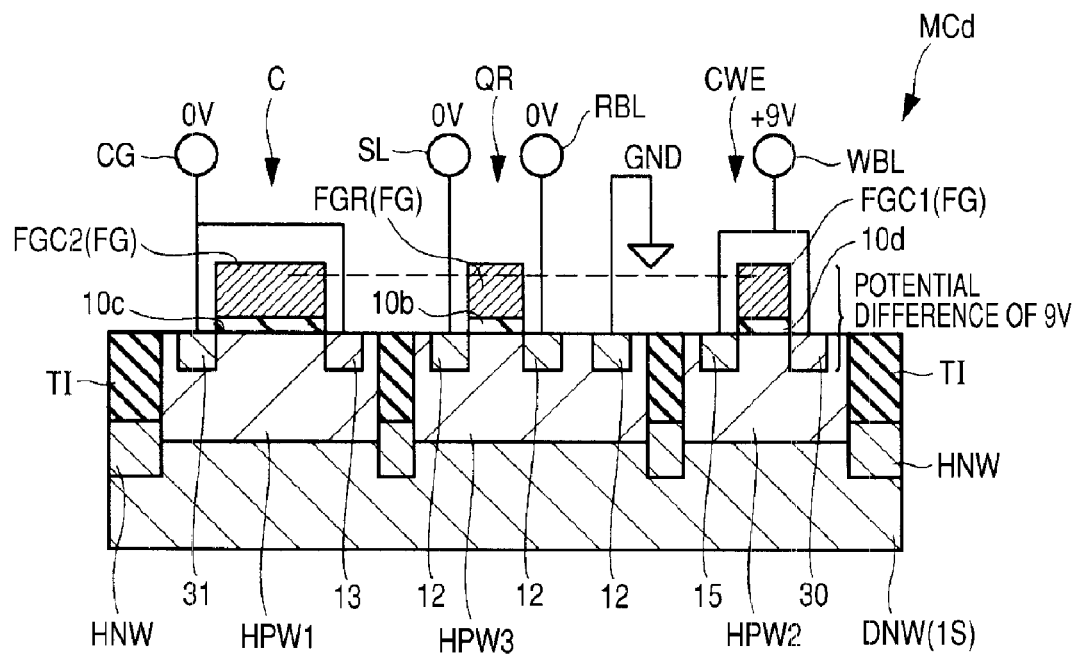
FIG. 32 is a cross-sectional view schematically showing a cross section of the memory cell of FIG. 31 in which the data disturb condition occurs.
Figure 33:
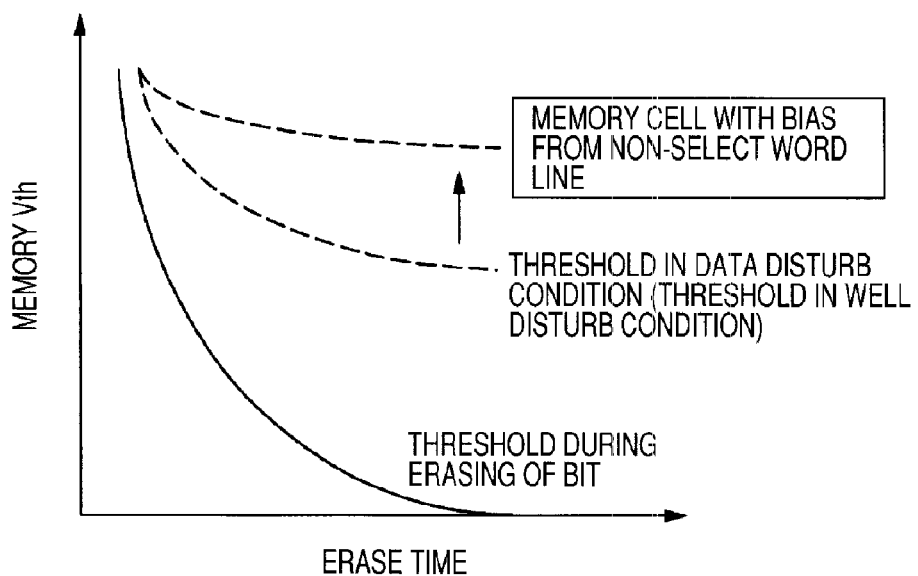
FIG. 33 is an illustrative view showing the characteristics of the threshold of the memory cell with respect to an erase time.

FIG. 31 is a layout diagram of a memory array in which the plurality of memory cells MC arranged at the positions where the word lines (control gate lines CG) and the data lines (bit lines WBL) intersect each other are arranged as blocks in a matrix. FIG. 31 shows an example of voltages applied to the individual components and the conditions of the individual memory cells when an erase operation is performed. During the erase operation also, the conditions of the individual memory cells include the selected condition (memory cells MCs), the word disturb condition (memory cells MCw), the data disturb condition (memory cells MCd), and the non-selected conditions other than those mentioned above. FIG. 32 is a cross-sectional view schematically showing the cross section of the memory cell MC in a condition when the voltages are applied to the individual components shown in FIG. 31, which shows the data disturb condition (memory cell MCd). The memory cell MC of FIG. 32 is the memory cell MC of FIG. 4 shown above in the first embodiment, which is shown herein in a schematic manner. FIG. 33 is an illustrative view showing the characteristics of the threshold of the memory cell MC with respect to an erase time when the voltages shown in FIG. 31 are applied to the individual components.

By applying the voltages to the individual components as shown in FIG. 31, electrons are emitted from the capacitor electrode FGC1 of the memory cell to which writing has been performed to the well HPW2 of the write/erase element CWE through the capacitor insulating film 10d with the FN tunnel current of the entire surface of the channel, conversely to the case shown in FIG. 24, so that data is erased.

However, as shown in FIG. 31, each of the data lines for applying a voltage of 9 V to the well HPW2 of the write/erase element CWE of the corresponding memory cell MCs is coupled to each of the memory cells MCd other than the memory cell MCs as shown in FIG. 31, so that the data disturb condition occurs in the memory cell MCd. Specifically, in the memory cell MCd (see FIG. 32) in the data disturb condition, a control voltage of 0 V is applied from the corresponding control gate line CG to the well HPW1 of the capacitor element C, while a positive voltage of 9 V is applied from the corresponding bit line WBL to the well HPW2 of the write/erase element CWE, so that the potential difference of about 9 V therebetween is applied to the capacitor insulating film 10d to lower the threshold (see FIG. 33).

Thus, the erasing to the selected memory cell MCs causes the disturb condition in each of the memory cells MCd to which erasing should not be performed to raise the threshold thereof. Since each of the memory cells MC utilizes a FN tunnel current, even with 9 V applied only to one of the wells when the memory cell MC is half-selected, a threshold variation is likely to occur. Unless the disturb condition decreases, erroneous erasing occurs.

Figure 34:
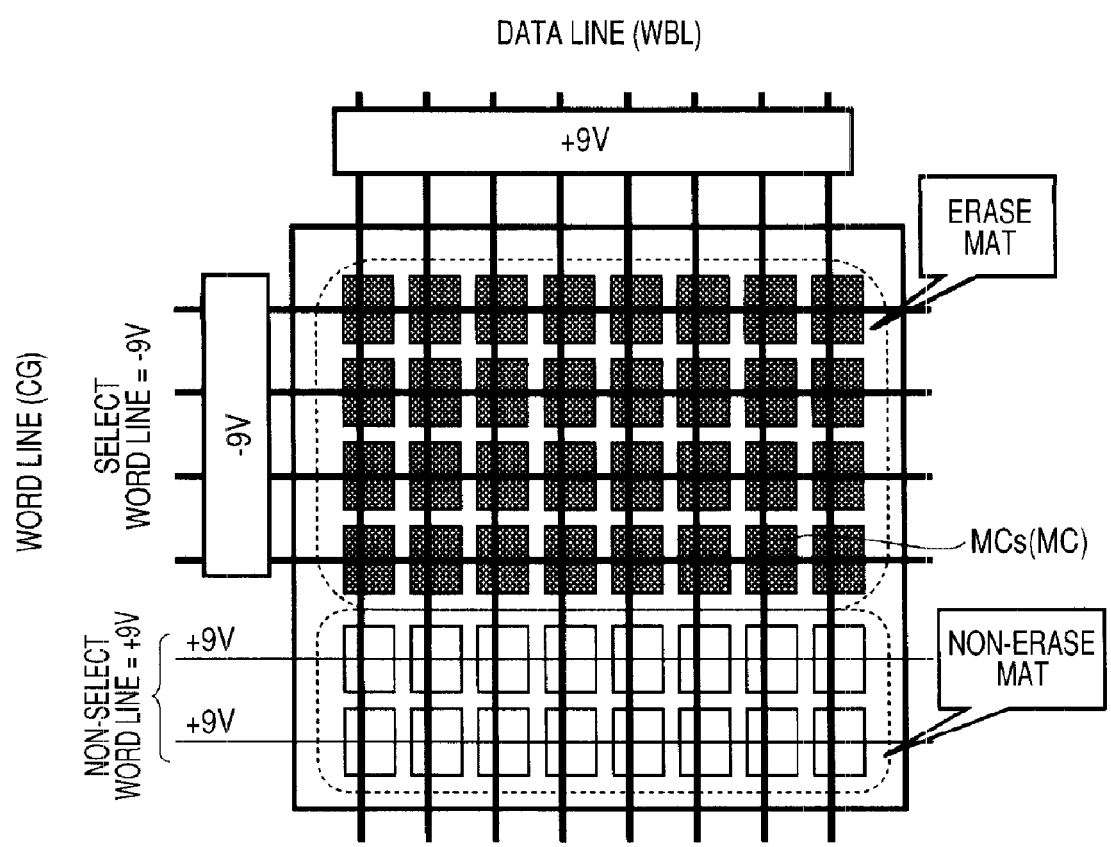
FIG. 34 is an illustrative view of another example of the erase operation to the memory array of FIG. 31.
Figure 35:
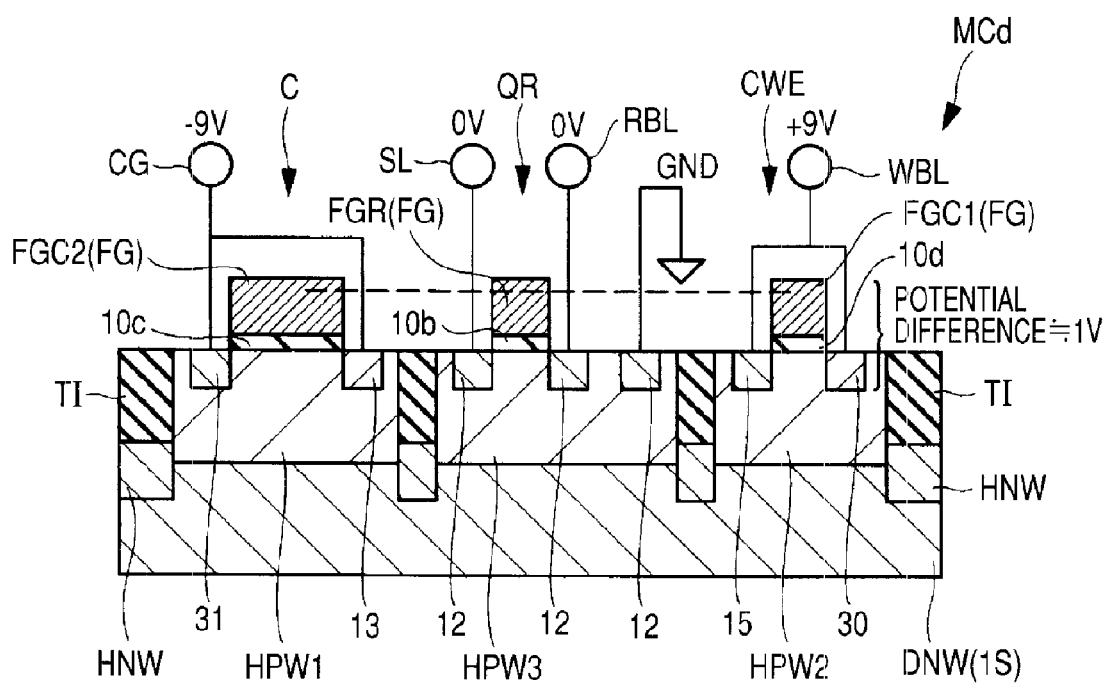
FIG. 35 is a cross-sectional view schematically showing a cross section of the memory cell of FIG. 34 in which the data disturb condition occurs.

In view of the foregoing, a description will be given to a technology which can reduce the disturb condition in the memory array by adjusting the voltages applied to the individual components during data erasing. FIG. 34 is a layout diagram of a memory array in which the plurality of memory cells MC arranged at the positions where the word lines (control gate lines CG) and the data lines (write bit lines WBL) intersect each other are arranged as blocks in a matrix. FIG. 34 shows the case where voltages different from those applied to the individual components shown in FIG. 31 are applied thereto. FIG. 35 is a cross-sectional view schematically showing the cross section of the memory cell MC in a condition when the voltages shown in FIG. 34 are applied to the individual components. The memory cell of FIG. 35 is the memory cell of FIG. 4, which is shown herein in a schematic manner.

As shown in FIG. 34, to perform an erase operation to each of the selected memory cells MCs, a negative voltage of −9 V is applied to each of the word lines (select word lines), and a positive voltage of 9 V is applied to each of the data lines (select data lines). As a result, a tunnel current is generated in each of the selected memory cells MCs to perform the erasing of data, as described above. In addition, a positive voltage (counter voltage) of 9 V is applied to each of the non-select word lines.

Consequently, as shown in FIG. 35, a positive voltage of 9 V is applied from the corresponding control gate line CG (word line) to the well HPW1 of the capacitor element C, while a positive voltage of 9 V is applied from the corresponding bit line WBL (data line) to the well HPW2 of the write/erase element CWE, so that the potential difference of about 1 V therebetween is applied to the capacitor insulating film 10d. The potential difference (about 1 V) is lower than the potential difference (about 9 V) resulting from the application of the voltages shown in FIG. 32. Thus, during the erase operation, it is possible to separate an erase region and a non-erase region from each other in the memory array (mat). In this case, erasing of data can be prevented by applying a potential of 9 V to each of the word lines in the region of the mat where erasing of data is not intended to set the potential difference applied to the capacitor insulating film 10d to approximately 0 V.

Thus, the potential difference applied to the capacitor insulating film 10 lowers to accordingly allow a reduction in data disturb condition, and allow a reduction in threshold variation, as shown in FIG. 33. When an erase mat can be ensured within the region of the memory array, product information and post-shipment information added by the customer can be distinguishably contained in the same memory array (mat). Accordingly, it is no more necessary to prepare a plurality of memory arrays (mats). This allows a reduction in the area of the entire semiconductor chip.

It is also possible to apply the structure according to the present third embodiment to the second embodiment described above, and obtain the same effect.

(Embodiment 4)

As shown in the first embodiment described above, in disposing the plurality of memory cells MC in the nonvolatile memory region AM, the capacitor element C, the write/erase element CWE, and the read element QR each forming each of the memory cells MC, and the select MIS transistor QS are formed in the active regions L1 to L4 provided in the principal surface of the substrate 1S. These active regions L1 to L4 are provided in the wells HPW1, HPW2, and HPW3, and have different plan configurations depending on the difference between the elements and the like (see, e.g., FIG. 2). Accordingly, there should be a vacant region in the nonvolatile memory region AM where the wells HPW1, HPW2, and HPW3 are not formed.

Figure 36:
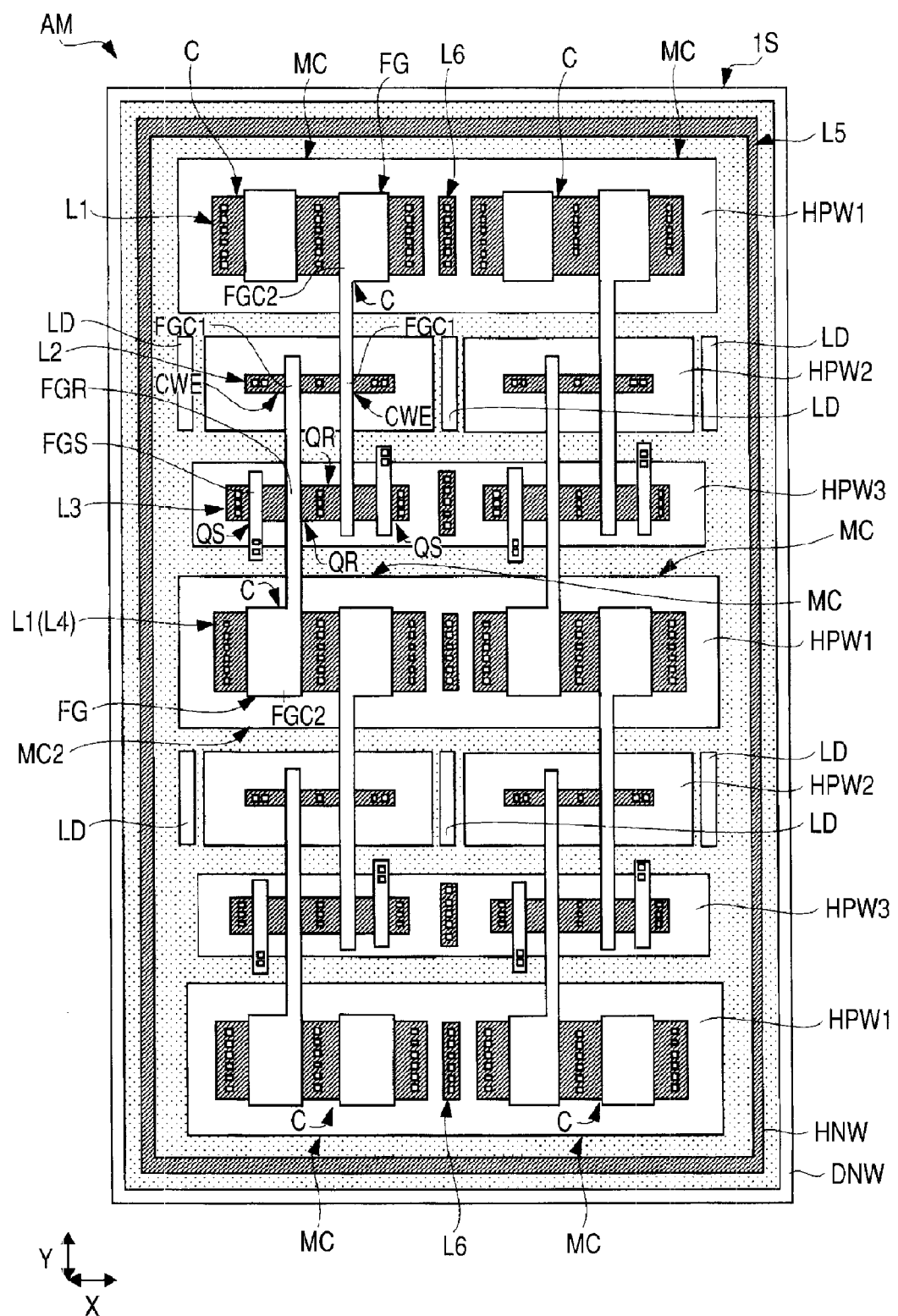
FIG. 36 is a plan view of an example of a nonvolatile memory arranged in a nonvolatile memory region in a fourth embodiment of the present invention.

Therefore, in the present fourth embodiment, a dummy active region (dummy active region) where no element is formed is arranged in the vacant region of the nonvolatile memory region AM, particularly in a sparse region where the active regions L1 to L4 are not formed, in a state electrically isolated from the active regions L1 to L4, as shown in FIG. 36.

Figure 37:
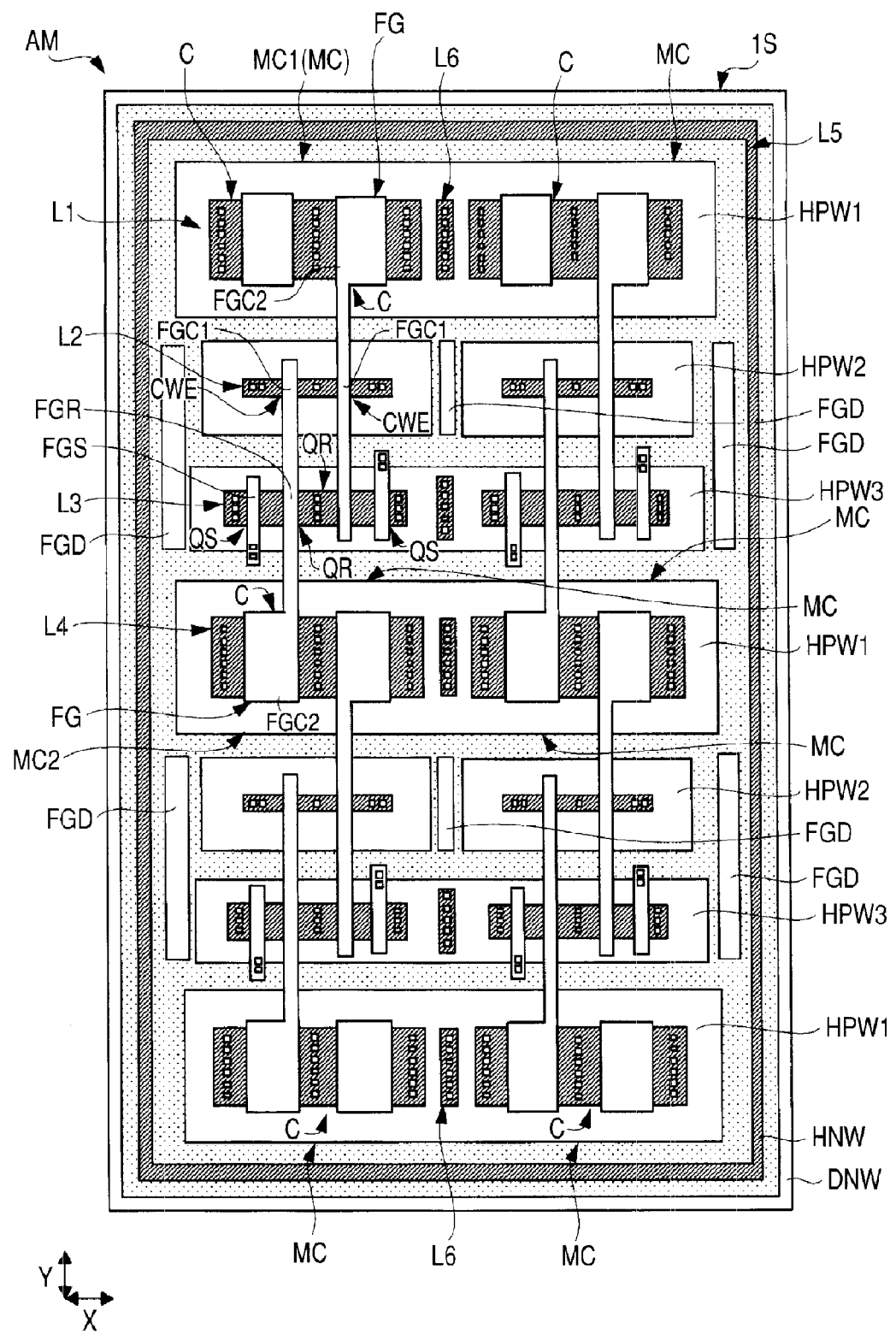
FIG. 37 is a plan view of another example of the nonvolatile memory arranged in the nonvolatile memory region in the fourth embodiment.

Otherwise, as shown in FIG. 37, a dummy gate electrode (dummy electrode) FGD not forming an element is arranged on the isolation region electrically isolated from the active regions L1 to L4.

By thus disposing the dummy active region LD or the dummy gate FGD in the sparse region without the active regions L1 to L4, the planarity in the nonvolatile memory region AM can be improved. Alternatively, by forming both of the dummy active region LD and the dummy gate FGD, the planarity can further be improved.

It is also possible to apply the structure according to the present fourth embodiment to the second embodiment or the third embodiment described above, and obtain the same effect.

Although the invention achieved by the present inventors has thus been described specifically based on the embodiments thereof, the present invention is not limited thereto. It will be understood that various changes and modifications can be made in the invention without departing from the gist thereof.

For example, the present invention is also applicable to a logic device, an analog device, an RF device, or the like provided that it is a semiconductor device having a main circuit formed by using a single-layer polysilicon gate, and a nonvolatile memory.

The present invention is to be widely used in the manufacturing industry of a semiconductor device, particularly a semiconductor device comprising a nonvolatile memory.

What is claimed is:

1. A semiconductor device comprising:
    a semiconductor substrate having a principal surface; and
    a plurality of nonvolatile memory cells arranged at positions where word lines and bit lines which are arranged in a matrix intersect each other, each of the nonvolatile memory cells comprising a data write/erase element, a data read element, and a capacitor element,
    wherein the nonvolatile memory cells include a first nonvolatile memory cell, and a second nonvolatile memory cell which are arranged adjacent to each other,
    wherein a first active region, a second active region, a third active region, and a fourth active region which are electrically isolated from each other are arranged in the principal surface,
    wherein the capacitor element of the first nonvolatile memory cell is formed in the first active region, the respective write/erase elements of the first and second nonvolatile memory cells are both formed in the second active region, the respective read elements of the first and second nonvolatile memory cells are both formed in the third active region, and the capacitor element of the second nonvolatile memory cell is formed in the fourth active region,
    wherein the second active region and the third active region are arranged, in a first direction, between the first active region and the fourth active region, and
    wherein a capacitor element of a third nonvolatile memory cell which follows, in the first direction, the second nonvolatile memory cell is formed in the fourth active region.

2. A semiconductor device according to claim 1,
    wherein the first, second, third, and fourth active regions are arranged in first direction,
    wherein the read element is arranged, in first direction, between the capacitor element and the write/erase element in the first nonvolatile memory cell, and
    wherein the write/erase element is arranged, in first direction, between the capacitor element and the read element in the second nonvolatile memory cell.

3. A semiconductor device according to claim 1, further comprising:
    a first well having a first conductivity type, and formed in the principal surface;
    a second well having a second conductivity type opposite to the first conductivity type, and formed to be included in the first well, while the second active region is arranged in the second well;
    a third well having the second conductivity type, and arranged to be included in the first well in electrically isolated relation to the second well, while the third active region is arranged in the third well;
    a fourth well having the second conductivity type, and formed to be included in the first well in electrically isolated relation to the second and third wells, while the first or fourth active region is arranged in the fourth well; and
    floating electrodes each arranged to extend in a first direction to two-dimensionally overlap the second, third, and fourth wells,
    wherein the write/erase element has a first electrode formed at a position where the corresponding floating electrode two-dimensionally overlaps the second well, a first insulating film formed between the first electrode and the semiconductor substrate, and a pair of semiconductor regions formed at positions sandwiching the first electrode therebetween in the second well,
    wherein the read element has a second electrode formed at a position where the corresponding floating electrode two-dimensionally overlaps the third well, a second insulating film formed between the second electrode and the semiconductor substrate, and a pair of semiconductor regions formed at positions sandwiching the second electrode therebetween in the third well, and
    wherein the capacitor element has a third electrode formed at a position where the corresponding floating electrode two-dimensionally overlaps the fourth well, a third insulating film formed between the third electrode and the semiconductor substrate, and a pair of semiconductor regions formed at positions sandwiching the third electrode therebetween in the fourth well.

4. A semiconductor device according to claim 3, further comprising:
    select MIS transistors each for allowing selection of the corresponding nonvolatile memory cell,
    wherein a gate electrode of each of the MIS transistors is electrically isolated from the corresponding floating electrode,
    wherein each of the floating electrodes extends from one end side of the third electrode to the first and second electrodes such that a length of the third electrode in a second direction intersecting the first direction is larger than respective lengths of the first and second electrodes in the second direction, and
    wherein the gate electrode of each of the select MIS transistors is arranged on the other end side of the third electrode to two-dimensionally overlap the third active region.

* * * * *